US010083942B2

United States Patent
Letowski et al.

(10) Patent No.: US 10,083,942 B2
(45) Date of Patent: Sep. 25, 2018

(54) ELECTRONIC POWER DEVICE WITH VERTICAL 3D SWITCHING CELL

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

(72) Inventors: Bastien Letowski, Grenoble (FR); Jean-Christophe Crebier, Bevenais (FR); Nicolas Rouger, Grenoble (FR); Julie Widiez, Genoble (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 15/524,032

(22) PCT Filed: Nov. 3, 2015

(86) PCT No.: PCT/EP2015/075642
§ 371 (c)(1),
(2) Date: May 3, 2017

(87) PCT Pub. No.: WO2016/071366
PCT Pub. Date: May 12, 2016

(65) Prior Publication Data
US 2017/0338208 A1    Nov. 23, 2017

(30) Foreign Application Priority Data
Nov. 4, 2014 (FR) ..................... 14 60636

(51) Int. Cl.
*H01L 23/48* (2006.01)
*H01L 23/52* (2006.01)
(Continued)

(52) U.S. Cl.
CPC ........ *H01L 25/071* (2013.01); *H01L 23/3672* (2013.01); *H01L 23/49805* (2013.01);
(Continued)

(58) Field of Classification Search
CPC combination set(s) only.
See application file for complete search history.

(56) References Cited

U.S. PATENT DOCUMENTS

2004/0130037 A1\* 7/2004 Mishra ............... H01L 21/8252
257/778
2004/0212057 A1   10/2004 Otremba
(Continued)

FOREIGN PATENT DOCUMENTS

| EP | 2 511 952 A1 | 10/2012 |
| EP | 2 731 132 A2 | 5/2014 |
| WO | 2011/004081 A1 | 1/2011 |

OTHER PUBLICATIONS

International Search Report dated Apr. 22, 2016 in PCT/EP2015/075642 filed Nov. 3, 2015.
(Continued)

*Primary Examiner* — Tram H Nguyen
(74) *Attorney, Agent, or Firm* — Oblon, McClelland, Maier & Neustadt, L.L.P.

(57) ABSTRACT

An electronic power device including: a first electronic power component in which all the electrodes are arranged at a first main face of the first electronic power component; and an electric contact element in which a first main face is arranged against the first main face of the first electronic power component and which includes plural separate elec-
(Continued)

trically conductive portions to which the electrodes of the first electronic power component are electrically connected. The first electronic power component and the electric contact element together form a stack such that a first lateral face of each of the portions of the electric contact element, substantially perpendicular to the first main face of the electric contact element, is arranged against at least one metallization of a support forming an electric contact of the first electronic power component.

34 Claims, 19 Drawing Sheets

(51) Int. Cl.
| | |
|---|---|
| *H01L 25/07* | (2006.01) |
| *H01L 23/367* | (2006.01) |
| *H01L 25/18* | (2006.01) |
| *H01L 23/498* | (2006.01) |
| *H01L 23/00* | (2006.01) |
| *H01L 23/373* | (2006.01) |

(52) U.S. Cl.
CPC .............. *H01L 24/32* (2013.01); *H01L 25/18* (2013.01); *H01L 23/3735* (2013.01); *H01L 2224/32141* (2013.01); *H01L 2924/19041* (2013.01); *H01L 2924/19101* (2013.01)

(56) References Cited

U.S. PATENT DOCUMENTS

| | | |
|---|---|---|
| 2005/0012117 A1 | 1/2005 | Fukuhara |
| 2007/0096278 A1 | 5/2007 | Nakatsu et al. |
| 2007/0096317 A1 | 5/2007 | Kiyohara |
| 2007/0138503 A1 | 6/2007 | St. Germain et al. |
| 2009/0160048 A1 | 6/2009 | Nakatsu et al. |
| 2011/0043955 A1* | 2/2011 | Noda ...................... H02H 9/046 361/56 |
| 2011/0266683 A1 | 11/2011 | Feng |
| 2012/0256189 A1 | 10/2012 | McDonald et al. |
| 2013/0062743 A1 | 3/2013 | Kim et al. |
| 2013/0083492 A1 | 4/2013 | Kim et al. |
| 2013/0321082 A1* | 12/2013 | Yamada .............. H01L 27/0605 330/277 |
| 2014/0131871 A1 | 5/2014 | Tsai et al. |
| 2014/0264919 A1 | 9/2014 | Hosseini et al. |
| 2015/0294910 A1 | 10/2015 | Tsai et al. |

OTHER PUBLICATIONS

French Search Report dated Sep. 24, 2015 in FR 1460636 filed Nov. 4, 2014.

Benaissa, L. et al., "A Vertical Power Device Conductive Assembly at Wafer Level using Direct Bonding Technology," 2012 24$^{th}$ International Symposium on Power Semiconductor Devices and ICs, IEEE, Jun. 2012, pp. 77-80.

Mermet-Guyennet, Michel et al., "3D Integration of Power Semiconductor Devices based on Surface Bump Technology," Integrated Power Systems (CIPS), 5$^{th}$ International Conference, Mar. 2008, 6 pages.

Rouger, N. et al., "True 3D Packaging Solution for Stacked Vertical Power Devices," Power Semiconductor Devices and ICs (ISPSD), 25$^{th}$ International Symposium on, May 2013, pp. 97-100.

Taibi, Rachid et al., "Full Characterization of Cu/Cu Direct Bonding for 3D Integration," ECTC, Conference 2010, pp. 219-225.

Kolar, Johann W. et al., "What are the big challenges in power electronics?" CIPS, 2014, 112 pages.

Domurat-Linde, Andre et al., "Analysis and Reduction of Radiated EMI of Power Modules," Integrated Power Electronics Systems (CIPS), 7$^{th}$ International Conference on, Mar. 2012, 6 pages.

U.S. Appl. No. 15/585,293, filed May 3, 2017, Letowski, et al.

* cited by examiner

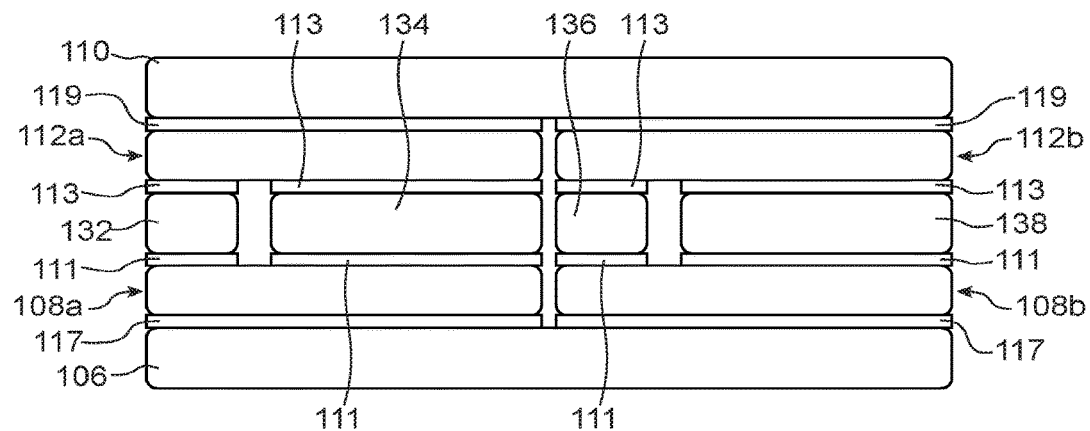
FIG.7B
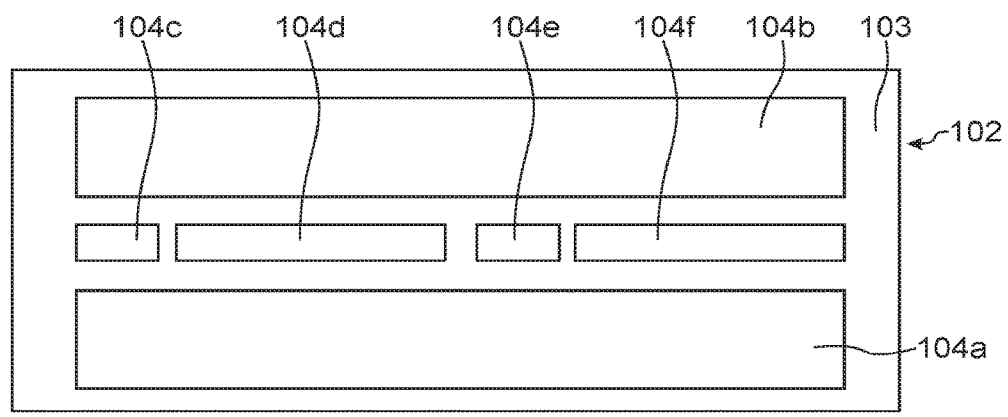
FIG.7C
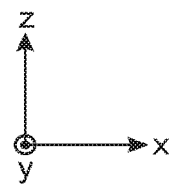

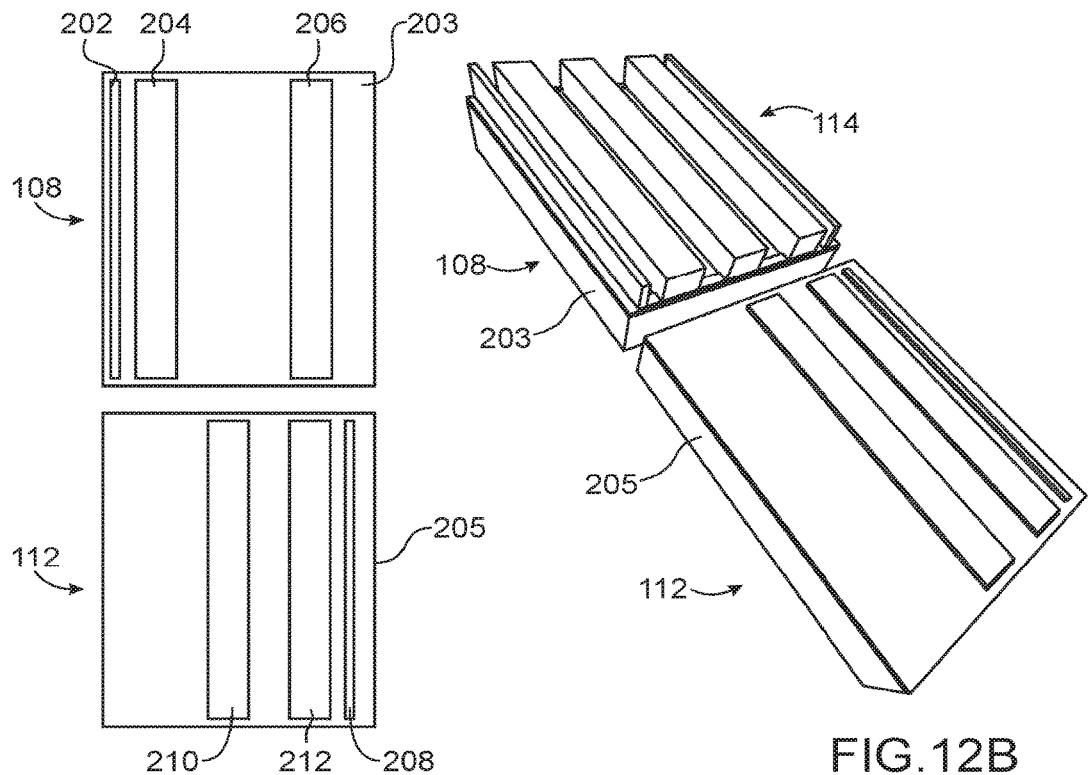
FIG.12A
FIG.12B
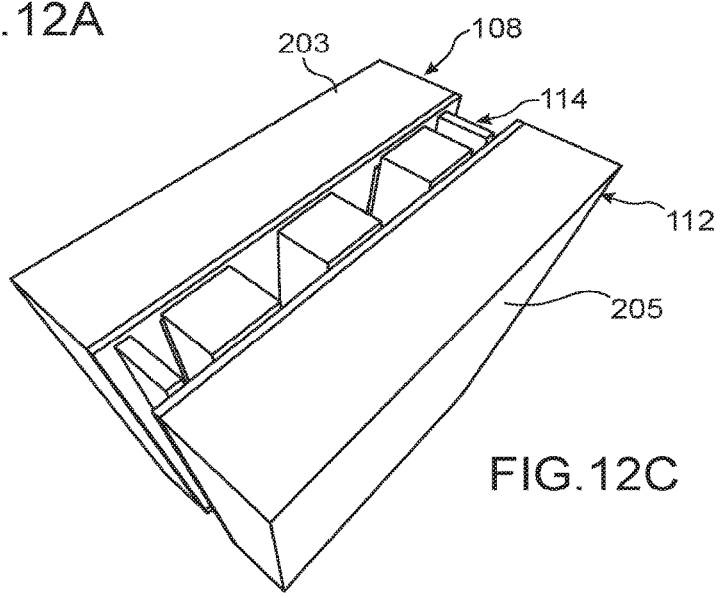
FIG.12C

ELECTRONIC POWER DEVICE WITH VERTICAL 3D SWITCHING CELL

TECHNICAL FIELD AND PRIOR ART

The invention relates to the field of power electronics, and more particularly to an electronic power device comprising at least one switching cell produced in three dimensions (3D) and integrated vertically on a support, as well as a method for producing such an electronic power device. The invention also relates to a static converter comprising at least one such electronic power device, as well as a method for producing such a static converter.

The power electronics field follows the same path as that of microelectronics, with a growing need to reduce the bulk and increase the performances of devices. Applications with more and more integrated functions are being developed, particularly for on-board systems, from the electric vehicle to the more electric airplane, and have to meet not just reliability and reproducibility criteria but also have the best possible cost/performance ratio.

The encapsulation of electronic power components (notably diodes and transistors) is generally carried out by a planar (or 2D) implementation by transfer of chips on a support, in a non-collective manner. An electronic power device 10 of 2D type is shown in FIG. 1. This device 10 comprises for example one or more switching cells. In the example of FIG. 1, a first chip 12, corresponding to a first electronic power component, is fixed on a first metallization 13 of a metallized substrate 14, for example of DBC type (or Direct Bond Copper, that is to say comprising a metallized ceramic), via a brazing forming an electrothermal connection between the first chip 12 and the first metallization 13. A second chip 15, corresponding to a second electronic power component, is fixed on a second metallization 23 of the substrate 14. The chips 12 and 15 here form a switching cell of the device 10. The substrate 14 is made integral with a front face of a conductive base 16, for example made of copper, also by brazing. A rear face of the base 16 is made integral with a heat sink 18 through a thermal grease 20. One or more electrical connections are produced on the front face by bonding wires 22 (in FIG. 1, a wire 22 connects the first chip 12 to the second chip 15), or strips, and by power connectors 24 for the interconnection with the exterior of the device 10 (in FIG. 1, two power connectors 24 are produced on the metallizations 13 and 23). The chips 12 and 15, the wire 22, a part of the power connectors 24 and the substrate 14 are surrounded by a passivating gel 26 and are encapsulated in a plastic package 28 resting on the base 16. The chips 12 and 15 are also coupled to one or more control circuits, also named drivers, not shown in FIG. 1, which notably make it possible to drive the controllable components, and thus to drive the switching of the switching cell(s) of the device 10.

Such a planar implementation is a very mature approach which attains high reliability levels but which is at the end its development. Furthermore, this type of planar structure and 2D approach with extraction of heat at the rear face and electrical interconnections at the front face of the device introduces additional interconnections that are distant from the ground plane formed by the base of the device. Power connectors and bonding wires introduce parasitic elements between the electronic power components and the decoupling capacitances, as well as between the control circuit(s) and the electrode(s) for controlling the transistor(s) of the switching cell(s).

Furthermore, an electronic power device produced according to this 2D approach also has the drawback of having a heat extraction capacity that is limited. In fact, the spreading out of the heat flux under the chips is limited by the width and the thickness of the copper tracks of the DBC substrate, which also has the function of insulating the power contacts vis-à-vis the cooling part of the device. The planar lay out of the electronic power device with all the electrical interconnections arranged in a same plane imposes a positioning of the electrical insulator (the ceramic of the DBC substrate) as near as possible to the power components, which limits the thermal conductivity of the assembly produced.

Finally, the DBC substrate introduces parasitic capacitances between the power interconnections and the ground of the system which form common-mode parasitic propagation paths, which are very detrimental for producing a static converter. In fact, these electromagnetic perturbation propagation paths induce common-mode currents of which the amplitude of the harmonics in the frequency domain is governed by standards. Planar electronic power devices may produce important quantities of common-mode perturbations on account of the very structure of their package, which imposes using them while limiting their performances in order to limit the perturbations caused.

To limit these drawbacks, several constraints have to be taken into account when designing 2D electronic power devices:
  optimising the geometries of the circuits in order to have symmetries ensuring a balancing of the parasitic components and a reduction of common-mode currents;
  favouring the use of copper strips, such as Bus-Bars, instead of bonding wires, for the DC+ and DC− supply potentials of the device;
  inserting decoupling capacitors actually inside the devices, that is to say as close as possible to the switching, in order to improve also the quality of the switching and reduce differential mode currents.

The limitations of planar devices oblige the designer to find a compromise between thermal stresses, which leads to moving the chips further apart from each other, and EMC (electromagnetic compatibility) stresses, which quite the contrary leads to bringing them closer together to reduce the electromagnetic radiation produced. Bringing the components closer together nevertheless increases the perturbing couplings between the power components and the ancillary circuits such as the control elements. In addition, bringing the components closer together can, on account of their high operating temperatures, reduce their reliability.

An electronic power device having a 2D or planar structure thus has the following limitations:
  thermal limitations: evacuation of the heat produced by the device in operation by a single face of the device;
  electrical limitations: inductive character of the switching mesh (bonding wires and power connectors), electromagnetic couplings between the power components and the control elements, common-mode capacitive couplings, electromagnetic radiations;
  thermal and mechanical limitations with regard to the reliability of the assemblies and electrical interconnections, notably with the implementation of large size chips (above around 1 $cm^2$) and brazed over their whole rear face, which is subjected to considerable expansions, and also with regard to the bonding wires with electromechanical strains capable of producing bonding "lift-off" (disbondment);

geometric limitations: the dissymmetry causes difficulties of optimal design, spreading out and distribution of the thermal potentials at the level of the device and the chips;

limitations linked to the production method: the assembly of the device is carried out chip to chip, in a non-collective manner.

To increase the compactness of electronic power devices and the EMC performances of these devices, it is possible to produce devices in the form of 3D assemblies, which has the following advantages:

cooling is possible on both faces of the electronic power device;

the perturbing electrical potentials are confined by metal surfaces, which makes it possible to reduce radiated mode perturbations.

The production of electronic power devices in the form of 3D structures, or assemblies, is not easy given the electrical, thermal and even mechanical interconnections to produce, and several solutions have been proposed. However, they are all based on conventional packaging methods, namely brazing or bumping (connection beads). Such structures are arranged horizontally in order to remain compliant with current standards for electronic power devices, with a recovery of contacts in a lateral manner. These assemblies and interconnections are made chip to chip with a unitary alignment. The document "3D Integration of Power Semiconductor Devices based on Surface Bump Technology" of M. Mermet-Guyennet et al., Integrated Power Systems (CIPS), 2008, 5th International Conference on, 11-13 Mar. 2008, pages 1-6, describes the production of such 3D structures. Nevertheless, such structures cannot be produced in a collective manner.

The document US 2013/0062743 A1 describes a 3D electronic power device comprising power components and a cooling system designed separately then assembled to form the device. Cooling is carried out at both faces of the device via insulating layers arranged between the conducting layers and the cooling elements. However, the extraction of the heat produced by the components is carried out only by one of the faces of the components located on the side of the cooling elements. In addition, the insulating layers increase the heat resistance of the assembly and their arrangement as near as possible to the chips does not have the effect of spreading out the thermal power to dissipate. From an electromagnetic perturbations viewpoint, the mid-point, at which the main perturbing signal is generated, is brought back onto the conducting layers by horizontal contact elements. A configuration similar to that of a planar device with a high common-mode parasitic capacitance is thus obtained. A control circuit is also integrated in the device, as near as possible to the transistors. However, this circuit is subjected to a high temperature because it is placed near to the heat evacuation flux. Its interconnection is achieved by bonding, which may be problematic for the reliability of the device during thermal cycles as described previously.

The document "True 3D packaging solution for stacked vertical power devices" of N. Rouger et al., Power Semiconductor Devices and ICs (ISPSD), 2013, 25th International Symposium on, pages 97-100, 26-30 May 2013, also describes an electronic power device produced in the form of a 3D assembly arranged horizontally on a support. Such an electronic power device has the same drawbacks as those described previously.

DESCRIPTION OF THE INVENTION

An aim of the present invention is to propose a novel type of electronic power device not having the drawbacks of the 2D and 3D devices described previously and the structure of which enables its production in a collective manner (and thereby avoid a chip to chip transfer on a support for its assembly).

To do so, an electronic power device is proposed comprising:

at least one first electronic power component arranged at a first main face of a first substrate;

at least one electric contact element arranged on the first electronic power component such that the first electronic power component is arranged between the electric contact element and the first substrate and is electrically connected to a first main face of the electric contact element;

and in which the first substrate, the first electronic power component and the electric contact element together form a stack such that a first lateral face of at least the electric contact element, substantially perpendicular to the first main face of the electric contact element, is arranged against at least one metallization of a support forming at least one electric contact of the first electronic power component.

Such an electronic power device comprises a 3D assembly (formed of at least the first electronic power component, the first substrate and the electric contact element) arranged vertically on the support, which comprises the metallization(s) forming the electric contact(s) of the device, for example the input and output electric contacts of the switching cell when the device comprises such a cell. Such a lay out of this 3D assembly on the support, obtained thanks to the fact that the electric contacts are available on the edge of the 3D assembly, notably makes it possible not to resort to horizontal electric contacts, that is to say planar electric contacts, notably bringing the signal from the mid-point of the switching cell to the level of the support when the device comprises such a cell, which may be behind strong common-mode parasitic capacitances in the device.

This electronic power device makes it possible to reduce electromagnetic perturbations while improving the electrical performances of the device compared to 2D and 3D devices of the prior art.

This vertical lay out of the assembly on the support also has the advantage of avoiding the use of bonding wires because all of the electric contacts are directly accessible at the level of the lateral faces of the stack, that is to say at the edge of the stack. This lay out also makes it possible to have reliable and efficient interconnections corresponding to direct connections between the metallizations of the support and the lateral faces of the stack, thereby reducing common-mode perturbations in the device. Such a vertical lay out also has the advantage of reducing the occupied area on the support. In addition, this configuration makes it possible to minimise the length of the interconnections of the electronic power component(s).

The evacuation of heat takes place parallel to the support, for example through a heat dissipation system placed on one or both lateral faces (faces substantially perpendicular to the support).

Such an electronic power device also has the advantage of being able to be designed and produced using collective methods enabling the simultaneous production of several 3D assemblies, for example several switching cells, in a reliable manner.

Such an electronic power device also has the advantage of enabling a separation of the electrical and thermal propagation paths in the device, that is to say an optimal decoupling between the electromagnetic and thermal magnitudes.

Such an electronic power device also makes it possible to achieve the electrical interconnection of multiple power components forming one or more bridge arms or switching cells at the scale of the wafer.

The structure of this device forms an almost totally symmetrical stack ensuring a balancing of the parasitic components and a reduction of common-mode currents.

These advantages are moreover obtained by the invention which proposes an electronic power device comprising:
- at least one first electronic power component in which all the electrodes are arranged at a first main face of the first electronic power component;
- at least one electric contact element in which a first main face is arranged against the first main face of the first electronic power component and which comprises several separate electrically conductive portions to which the electrodes of the first electronic power component are electrically connected;

in which at least the first electronic power component and the electric contact element together form a stack such that a first lateral face of each of the portions of the electric contact element, substantially perpendicular to the first main face of the electric contact element, is arranged against at least one metallization of a support forming at least one electric contact of the first electronic power component.

The invention thus proposes a vertical lay out of the stack formed of the electric contact element and the first electronic power component, which is particularly suited to a first electronic power component that comprises all its electrodes at a same face, as is the case of lateral electronic power components. Thus, the face of the component that does not comprise the electrodes may be freely accessible and may serve for example to improve cooling notably when the substrate serving as mechanical support for producing the first electronic component is eliminated.

The first electronic power component may comprise a first semiconductor substrate forming a second main face, opposite the first main face, of the first electronic power component.

The electronic power device may comprise several first electronic power components such that all the electrodes of each of the first electronic power components are arranged at a first main face of each of the first electronic power components and electrically connected to the portions of the electric contact element at the first main face of the electric contact element, and such that the first electronic power components are arranged one on top of the other along a direction substantially perpendicular to the first lateral faces of the portions of the electric contact element.

In this case, the first electronic power components may together form several switching cells, each switching cell being able to be formed by two first electronic power components electrically connected together by at least one of the portions of the electric contact element. In this arrangement, all the switching cells are formed by electronic power components produced simultaneously on a same substrate, then assembled on the support. Thus, the electronic power device is not produced by the assembly of individual switching cells on a support, but is produced in an overall manner as of the production of the first electronic power components.

The electronic power device may further comprise at least one heat sink arranged against a second main face, opposite the first main face, of the second electronic power component. In this configuration, it is possible to carry out cooling from the front face of the first electronic power components, that is to say from the face at which are located the electrodes of the first electronic power components. Such cooling is much more efficient than cooling carried out through the substrate on which are located the first electronic power components.

The device may further comprise at least one second electronic power component arranged at a first main face of a second substrate and such that the electric contact element is arranged between the first and second electronic power components and comprises a second main face, opposite the first main face, to which is electrically connected the second electronic power component, in which the second electronic power component and the second substrate may form part of the stack that forms a switching cell, and the electric contact element may comprise at least one first metal portion to which are connected the first and second electronic power components while forming a mid-point of the switching cell.

The electronic power device may further comprise at least one second electronic power component in which all the electrodes are arranged at a first main face of the second electronic power component, in which a second main face, opposite the first main face, of the electric contact element may be arranged against the first main face of the second electronic power component, the electrodes of the second electronic power component being able to be electrically connected to the portions of the electric contact element, and in which the second electronic power component may form part of the stack and may form, with the or one of the first electronic power component(s), a switching cell.

In this configuration, the different materials are associated in a symmetrical manner with respect to the electric contact element, which makes it possible to reduce the mechanical stresses and thus to enhance the reliability of the device.

The first and second electronic power component(s) may each comprise at least one transistor or a thyristor or a rectifier diode. When the or one of the first and/or the or one of the second electronic power component(s) comprises a transistor or a thyristor, said transistor or said thyristor may be coupled to at least one antiparallel diode.

The first and second substrates may comprise respectively first and second metal layers on which are arranged respectively the first and second electronic power components and forming the electrodes of the switching cell on which the electrical supply potentials of the switching cell are intended to be applied, and first lateral faces of the first and second metal layers, substantially perpendicular to the first main faces of the first and second substrates, may be arranged against the metallizations of the support which form the electric contacts of the switching cell.

According to a first exemplary embodiment:
- the first electronic power component may comprise at least one PMOS transistor in which the drain is connected to the first metal layer, in which the source is connected to the first metal portion of the electric contact element and in which the gate is connected to a second metal portion of the electric contact element, and
- the second electronic power component may comprise at least one NMOS transistor in which the drain is connected to the second metal layer, in which the source is connected to the first metal portion of the electric contact element and in which the gate is connected to the second metal portion of the electric contact element.

According to a second exemplary embodiment:
- the first electronic power component may comprise at least one rectifier diode in which the anode is connected to the first metal layer and in which the cathode is connected to the first metal portion of the electric contact element, and the second electronic power component may comprise at least one NMOS transistor in which the drain is connected to the second metal layer, in which the source is connected to the first metal portion of the electric contact element and in which the gate is connected to a second metal portion of the electric contact element.

According to a third exemplary embodiment:

the first metal layer may comprise several portions separated to each other, the first electronic power component may comprise at least one NMOS transistor in which the drain is connected to the first metal portion of the electric contact element, in which the gate is connected to a first portion of the first metal layer and in which the source is connected to a second portion of the first metal layer, the second electronic power component may comprise at least one NMOS transistor in which the drain is connected to the second metal layer, in which the source is connected to the first metal portion of the electric contact element and in which the gate is connected to a second metal portion of the electric contact element, and in which the second metal portion of the electric contact element may be electrically insulated from the first electronic power component by at least one dielectric portion arranged between the second metal portion of the electric contact element and the first electronic power component.

When the first and second electronic power components each comprise a transistor, each transistor may comprise gate and source regions arranged next to each other and of substantially rectangular shape. The first and second metal portions of the electric contact element may be arranged next to each other, be each of substantially rectangular shape and each arranged against one of the gate and source regions of the first and second transistors (in the case of a PMOS transistor and a NMOS transistor) or against one of the gate and source regions of the NMOS transistor corresponding to the second electronic power component (in the case of the first component corresponding to a rectifier diode or to an NMOS transistor) and be in contact with at least two adjacent metallizations of the support. Such a configuration of the electric contact element facilitates the collective production of several switching cells.

The three exemplary embodiments described above correspond to electronic power components of vertical type.

In an alternative embodiment, notably in the case of electronic power components of lateral type, the first and second substrates may be semiconductor substrates in which the first and second electronic power components are produced, all the electrodes of the first and second electronic power components may be connected to the electric contact element, and the electric contact element may comprise second metal portions forming at least some electrodes of the switching cell on which electrical supply potentials of the switching cell are intended to be applied, first lateral faces of the second metal portions, substantially perpendicular to the main faces of the first and second substrates, being able to be arranged against the metallizations of the support which form the electric contacts of the switching cell.

This solution makes it possible to have a reduction in switching mesh parasitic inductances compared to standard technologies resorting to connections of strip type or by wires, thanks to the interconnections with the electric contact element.

Each of the second metal portions of the electric contact element may be electrically connected to at least one of the first and second electronic power components.

The second electronic power component may comprise a second semiconductor substrate forming a second main face, opposite the first main face, of the second electronic power component.

The electronic power device may comprise several second electronic power components such that all the electrodes of each of the second electronic power components are arranged at a first main face of each of the second electronic power components and electrically connected to the portions of the electric contact element at the second main face of the electric contact element, and such that the second electronic power components are arranged one on top of the other along a direction substantially perpendicular to the first lateral faces of the portions of the electric contact element. In this configuration, all the switching cells are formed by electronic power components which are able to be produced in a collective manner on two substrates, then assembled on the support. Thus, the electronic power device is not produced by the assembly of individual switching cells on a support, but is produced in an overall manner as of the production of the first and second electronic power components.

Each of the first electronic power components may be electrically connected to one of the second electronic power components by one of the portions of the electric contact element while together forming a switching cell.

The electronic power device may further comprise at least one second electronic component of MOS type in which all the electrodes are arranged at a first main face of the second electronic component of MOS type, in which a second main face, opposite the first main face, of the electric contact element may be arranged against the first main face of the second electronic component of MOS type, the electrodes of the second electronic component of MOS type being able to be electrically connected to the portions of the electric contact element.

In this case, the electronic power device may comprise several second electronic components of MOS type forming a circuit for controlling the first electronic power component, and/or the first electronic power component may be a depletion transistor and the or one of the second electronic component(s) of MOS type may be an enhancement transistor electrically coupled to the first electronic power component according to a cascode type configuration, which makes it possible to obtain a power enhancement transistor.

The electronic power device may further comprise, notably when the first and/or second electronic power component(s) form at least one switching cell, at least:

a decoupling capacitor connected to the switching cell such that the switching cell is arranged between the support and the decoupling capacitor, and/or a control circuit capable of controlling a switching of the switching cell and arranged on a rear face of the support which is opposite a front face of the support at which are located the metallizations, and/or heat sinks arranged against the second main faces of the first and second substrates opposite the first main faces.

This arrangement of the decoupling capacitor makes it possible to produce a capacitive decoupling as near as possible to the switching cell, minimising the interconnections between the cell and the capacitor. This decoupling capacitor arranged at the upper lateral faces of the stack also makes it possible to filter differential mode perturbations, generated by switchings of the cell, as near as possible to the source of these perturbations, thereby reducing the current circulation mesh between the capacitor and the electronic power components.

In addition, such a lay out of the control circuit under the support makes it possible to reduce coupling between the power signals of the switching cell and the control signals sent by the control circuit The heat sinks may form part of a package resting on the support and in which said stack is arranged, a bottom wall of the package forming an additional heat sink.

The electronic power device may comprise several first and second electronic power components forming several switching cells electrically connected together and in which the first and second substrates are common to the switching cells.

The invention also relates to a static converter comprising at least one electronic power device such as described above.

A method for producing an electronic power device is also described, comprising at least the implementation of the following steps:
  producing at least one first electronic power component at a first main face of a first substrate;
  making the first electronic power component integral with at least one electric contact element such that the first electronic power component is arranged between the electric contact element and the first substrate and is electrically connected to a first main face of the electric contact element, and such that the first substrate, the first electronic power component and the electric contact element together form a stack;
  making at least one first lateral face of at least the electric contact element, substantially perpendicular to the first main face of the electric contact element, integral against at least one metallization of a support forming at least one electric contact of the first electronic power component.

Such a method has the advantage of producing a packaging at the scale of the wafer, making it possible to assemble all the components of several electronic power devices with common steps.

The invention also pertains to a method for producing an electronic power device, comprising at least the implementation of the following steps:
  producing at least one first electronic power component in which all the electrodes are arranged at a first main face of the first electronic power component;
  making the first electronic power component integral with at least one electric contact element such that a first main face of the electric contact element is arranged against the first main face of the first electronic power component, electrically connecting several separate portions of the electric contact element to the electrodes of the first electronic power component, the first electronic power component and the electric contact element together forming a stack;
  making at least one first lateral face of each of the portions of the electric contact element, substantially perpendicular to the first main face of the electric contact element, integral against at least one metallization of a support forming at least one electric contact of the first electronic power component.

The method may further comprise, before making the electric contact element integral with the support, the steps of:
  producing at least one second electronic power component at a first main face of a second substrate,
  making the second electronic power component integral with a second main face, opposite the first main face, of the electric contact element to which is electrically connected the second electronic power component, such that the second electronic power component and the second substrate form part of the stack which forms a switching cell,
  and in which the electric contact element may comprise at least one first metal portion to which are connected the first and second electronic power components while forming a mid-point of the switching cell.

The method may further comprise, before making the electric contact element integral with the support, the steps of:
  producing at least one second electronic power component in which all the electrodes are arranged at a first main face of the second electronic power component,
  making the second electronic power component integral with a second main face, opposite the first main face, of the electric contact element, such that the second main face of the electric contact element is arranged against the first main face of the second electronic power component and electrically connecting the electrodes of the second electronic power component to the portions of the electric contact element, the second electronic power component forming part of the stack and forming, with the first electronic power component, a switching cell.

According to a first alternative embodiment of the production method:
  the first electronic power component may be produced collectively with several other first electronic power components from a first semiconductor substrate transferred beforehand onto a first metal layer then etched such that the first electronic power components are insulated from each other,
  the second electronic power component may be produced collectively with several other second electronic power components from a second semiconductor substrate transferred beforehand onto a second metal support then etched such that the second electronic power components are insulated from each other,
  the first and second electronic power components may be made integral with a structured metal layer forming several electric contact elements between the first and second electronic power components,
  the method further being able to comprise a step of cutting the first and second metal supports and the structured metal layer at the electric contacts of the stack, forming several assemblies each comprising at least one switching cell,
  and, for each switching cell, the cut parts of the first and second metal layers may form at least some electrodes of the switching cell on which the electrical supply potentials of the switching cell are intended to be applied, and the first lateral faces of the cut parts of the first and second metal layers may be arranged against the metallizations of the support which form the electric contacts of the switching cell.

The cutting step ends up in the formation of lateral faces at the metal layers, these lateral faces forming the parts of the electrodes of the switching cell which are arranged against the metallizations of the support.

According to a second alternative embodiment of the production method:
  the first electronic power component may be produced collectively with several other first electronic power components in a first semiconductor substrate, the second electronic power component may be produced collectively with several other second electronic power components in a second semiconductor substrate, the first and second electronic power components may be made integral with a structured metal layer forming several electric contact elements between the first and second electronic power components, the method further being able to comprise a step of cutting the first and second semiconductor substrates and the structured metal layer at the electric contacts of the stack, forming several assemblies each comprising at least one switching cell.

In addition, for each switching cell, all the electrodes of the first and second electronic power components may be connected to the electric contact element, and the electric contact element may comprise second metal portions forming at least some electrodes of the switching cell on which electrical supply potentials of the switching cell are intended to be applied, first lateral faces of the second metal portions, substantially perpendicular to the main faces of the first and second substrates, being able to be arranged against the metallizations of the support that forms the electric contacts of the switching cell.

The structured metal layer may comprise a first part arranged on the first electronic power components and a second part arranged on the second electronic power components, and the electric contact elements may be formed by joining the first and second parts of the structured metal layer.

The method may further comprise, after the cutting step, a step of polishing the electric contacts. Such a polishing notably makes it possible to eliminate potential "burrs" or residues stemming from the cutting of the different materials, in order to ensure that the electric contacts are all the same height so that they are all correctly in contact with the metallizations of the support, and also to reduce the unevenness and the roughness of the cut metal to facilitate transfer by brazing or welding on the support.

The method may further comprise, notably when the first and/or second electronic power component(s) form at least one switching cell:
- the assembly of at least one decoupling capacitor on a lateral face of the stack, electrically connected to the switching cell such that the switching cell is arranged between the support and the decoupling capacitor, and/or
- the assembly of at least one control circuit, capable of controlling a switching of the switching cell, on a rear face of the support which is opposite a front face at which are located the metallizations, and/or
- the assembly of heat sinks against second main faces, opposite the first main faces, of the first and second substrates.

The method may comprise the production of several first and second electronic power components forming several switching cells electrically connected together and in which the first and second substrates are common to the switching cells.

The invention also relates to a method for producing a static converter, comprising the implementation of a method for producing an electronic power device such as described above, being able to form at least one switching cell.

The invention also pertains to a method for producing an electronic power device, comprising at least the implementation of the following steps:
- collectively producing several first electronic power components at a first main face of a first substrate;
- making the first electronic power components integral with a structured metal layer forming several electric contact elements such that the first electronic power components are arranged between the electric contact elements and the first substrate and are electrically connected to the first main faces of the electric contact elements, and such that the first substrate, the first electronic power components and the electric contact elements together form a stack;
- cutting the stack substantially perpendicularly to the first main faces of the first substrate and the electric contact elements, forming lateral faces of the electric contact elements substantially perpendicular to the first main faces of the electric contact elements and corresponding to the electric contacts of the first electronic power components,
- making the electric contacts of the first electronic power components integral against the metallizations of a support.

The first electronic power components may be produced collectively from a first semiconductor substrate transferred beforehand onto a first metal layer then etched such that the first electronic power components are insulated from each other, the first electronic power components being able to be electrically connected to the first metal layer, and the first lateral faces of the cut parts of the first metal layer may form part of the electric contacts of the first electronic power components arranged against the metallizations of the support when making it integral with the support.

In an alternative embodiment, the first electronic power components may be produced collectively in a first semiconductor substrate, and all the electrodes of the first electronic power components may be connected to the electric contact element.

The first electronic power components may together form several switching cells, each switching cell being able to be formed by two first electronic power components electrically connected together by at least one portion of one of the electric contact elements.

The method may further comprise the steps of:
- collectively producing several second electronic power components or of MOS type at a first main face of a second substrate;
- making the second electronic power components integral with the structured metal layer, the electric contact elements being able to be arranged between the first and second electronic power components and electrically connected to the second electronic power components, and such that the second substrate and the second electronic power components may form part of the stack;

and the lateral faces of the electric contact elements may also correspond to electric contacts of the second electronic power components which are made integral against the metallizations of the support.

In this case, the first and second electronic power components may together form several switching cells, and each of the electric contact elements may comprise at least one first metal portion to which are connected one of the first electronic power components and one of the second electronic power components while forming a mid-point of one of the switching cells.

In this case:
- the second electronic power components may be produced collectively from a second semiconductor substrate transferred beforehand onto a second metal layer then etched such that the second electronic power components are insulated from each other, the second electronic power components being able to be electrically connected to the second metal layer, for each switching cell, the first lateral faces of the cut parts of the first and second metal layers may form at least some electrodes of the switching cell on which electrical supply potentials of the switching cell are intended to be applied, and the first lateral faces of the cut parts of the first and second metal layers may be arranged against the metallizations of the support.

In an alternative embodiment:

the second electronic power components may be produced collectively in a second semiconductor substrate, for each switching cell, all the electrodes of the first and second electronic power components may be connected to the electric contact element, and the electric contact element may comprise second metal portions forming at least some electrodes of the switching cell on which the electrical supply potentials of the switching cell are intended to be applied, first lateral faces of the second metal portions, substantially perpendicular to the main faces of the first and second substrates, may be arranged against the metallizations of the support.

The structured metal layer may comprise a first part arranged on the first electronic power components and a second part arranged on the second electronic power components, and the electric contact elements may be formed by joining the first and second parts of the structured metal layer.

BRIEF DESCRIPTION OF THE DRAWINGS

The present invention will be better understood on reading the description of exemplary embodiments given for purely indicative purposes and in no way limiting and by referring to the appended drawings, in which:

FIG. 7B is a schematic front view of the edge of the stack forming the two switching cells of FIG. 7A, which is intended to be connected to the support;

FIG. 7C shows the face of the support comprising the metallizations intended to be connected to the switching cells of FIG. 7A;

FIGS. 12A-12C show the steps of producing an electronic power device according to another exemplary embodiment;

Identical, similar or equivalent parts of the different figures described hereafter bear the same numerical references in order to make it easier to go from one figure to the next.

The different parts shown in the figures are not necessarily according to a uniform scale, in order to make the figures more legible.

The different possibilities (alternative embodiments and embodiments) should be understood as not being mutually exclusive and may be combined together.

DETAILED DESCRIPTION OF PARTICULAR EMBODIMENTS

Figure 1:
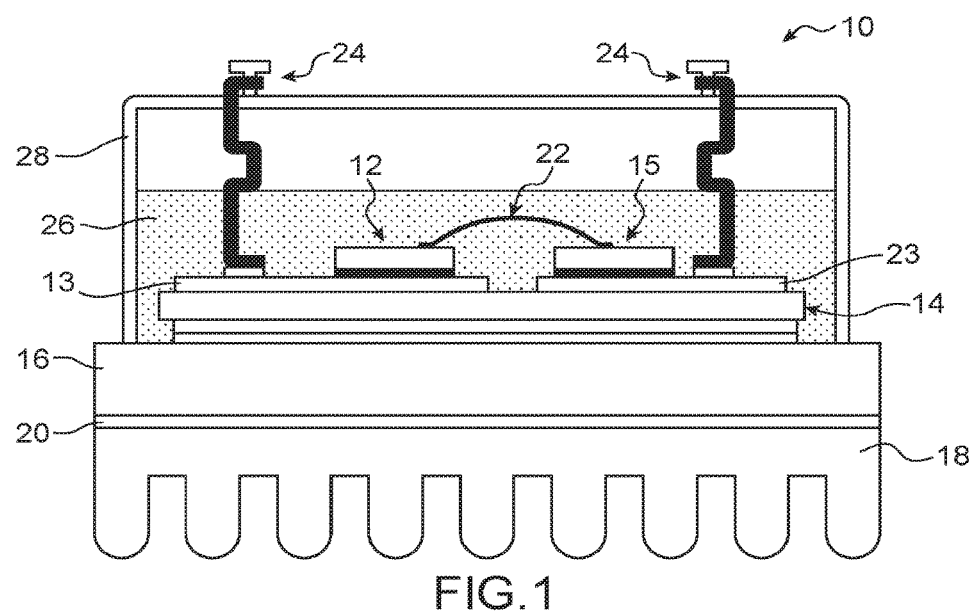
FIG. 1 schematically shows a 2D electronic power device according to the prior art.
Figure 2:
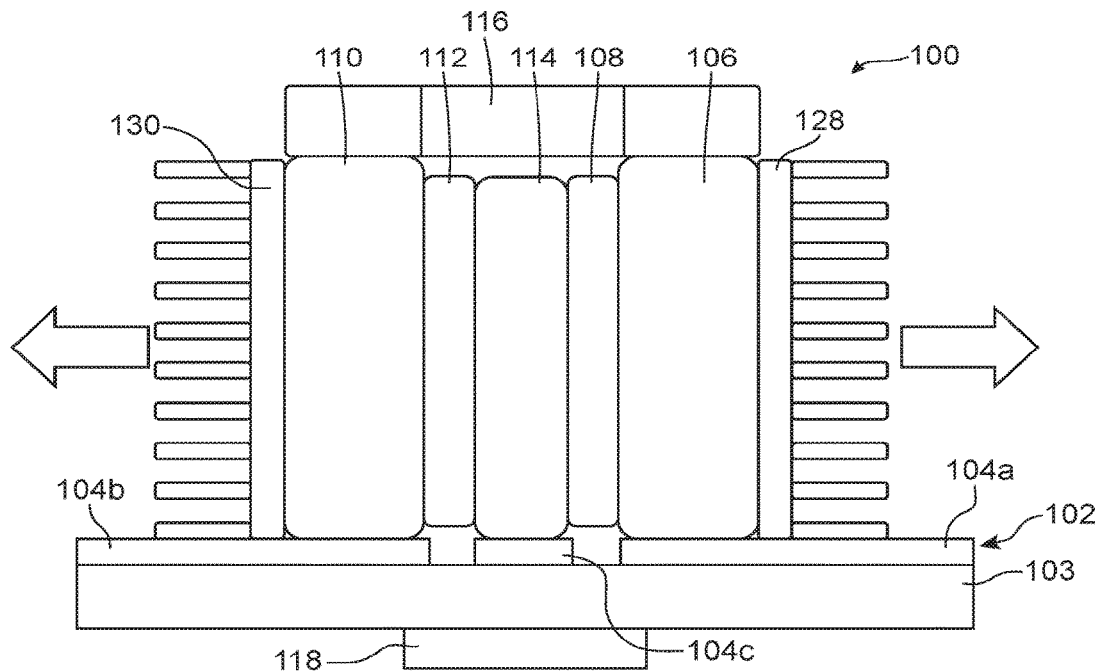
FIG. 2 schematically shows an electronic power device according to a first embodiment.

Reference is firstly made to FIG. 2, which shows an electronic power device 100 according to a first embodiment.

The device 100 comprises a support 102 of printed circuit board type (PCB) or corresponding to a DBC substrate. The support 102 comprises a dielectric layer 103 corresponding for example to an epoxy layer in the case of a support of printed circuit board type or a ceramic layer in the case of a DBC substrate. The support 102 also comprises metallizations 104 (three metallizations 104a, 104b and 104c are shown in FIG. 2), for example made of copper, arranged on a front face of the layer 103.

An electronic power module forming a 3D assembly, or stack, of electronic power components and corresponding to one or several switching cells, is arranged on the support 102. This stack comprises a first metal layer 106, for example made of copper, on which are arranged first electronic power components 108, at a first main face of the first metal layer 106. The first metal layer 106 forms a first electrode common to the first components 108 and on which a negative electrical supply potential DC− is intended to be applied. The stack also comprises a second metal layer 110, for example made of copper, on which are arranged second electronic power components 112, at a first main face of the second metal layer 110. The second metal layer 110 forms a second electrode common to the second components 112 and on which a positive electrical supply potential DC+ is intended to be applied. The layers 106 and 110 each have for example a thickness equal to around 500 μm, or between around 200 and 500 μm.

The stack also comprises an electric contact element 114, for example a metal lead frame and for example made of copper, comprising several unconnected conducting portions electrically connecting between them the first and second components 108 and 112. The electric contact element 114 forms notably a mid-point of the switching cell(s) of the device 100. The components 108, 112 are arranged against two opposite main faces of the element 114. The element 114 also forms the output terminal of the switching cell(s). The electrical connections between the components 108, 112 and the element 114 are for example produced by copper-copper bonding when the element 114 comprises copper and when the electrodes of the components 108, 112 comprise copper.

The components 108 and 112 are here vertical components arranged perpendicularly to the first main faces of the layers 106, 110 at which the components are arranged.

The stack is arranged vertically on the support 102, that is to say is connected and made integral with the metallizations 104 at its edge, that is to say at the level of a first side or a first lateral face of the stack. Thus, a first lateral face of the first layer 106, which is perpendicular to the first main face of the first layer 106, is electrically connected to the metallization 104a, a first lateral face of the second layer 110, which is perpendicular to the first main face of the second layer 110, is electrically connected to the metallization 104b, and a first lateral face of the element 114, that is to say a first lateral face of each of the electrically conducting portions forming the element 114, which is perpendicular to the main faces of the element 114, is electrically connected to several metallizations 104, including the metallization 104c. The number of electrically conducting portions that the element 114 comprises, and thus the number of metallizations 104 to which the element 114 is connected, depends notably on the nature and the number of electronic power components forming the switching cell(s). The vertical lay out of the stack, that is to say the arrangement of the electronic power components 108, 112 perpendicularly to the support 102, implies that the electronic power components of the stack are arranged horizontally (with respect to the front face of the support 102 on which the stack is arranged) in the device 100. The electrical connections between the layers 106, 110 and the metallizations 104a, 104b, as well as the electrical connection between the element 114 and the metallizations to which the element 114 is connected (including the metallization 104c) are for example produced by brazing.

A decoupling capacitor 116 is arranged at a second side, or second lateral face, of the stack, that is to say at the level of the second lateral faces of the layers 106, 110, opposite the first lateral faces arranged on the side of the support 102. This capacitor 116 comprises two electrodes electrically connected to one of the two layers 106, 110.

The device 100 also comprises a control circuit 118, or driver, capable of controlling the switching of the switching cell(s) of the stack and connected to the components 108, 112 by electrical connections (not shown in FIG. 2) which come through the support 102. This circuit 118 may comprise low voltage electronic components, for example CMOS transistors. The device 100 may also comprise other electronic components, for example passive elements such as one or more inductances, arranged on the rear face of the support 102.

Figure 3:
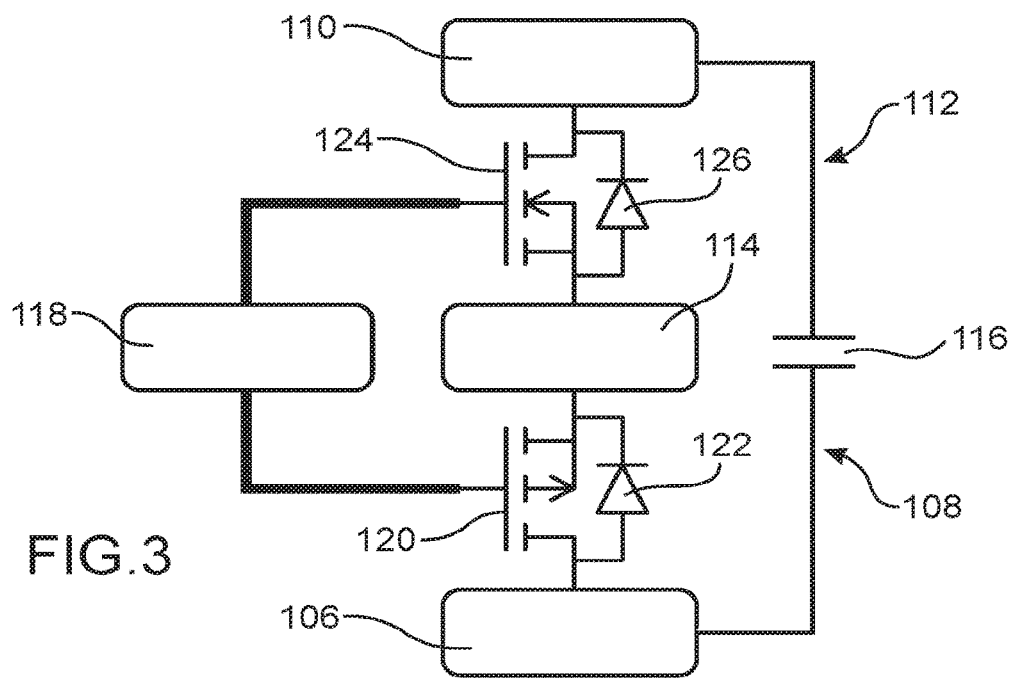
FIG. 3 shows an electrical diagram of the switching cell of the electronic power device shown in FIG. 2.

The device 100 here corresponds to a switching cell, the electrical diagram of which according to a first exemplary embodiment is shown in FIG. 3. The first components 108 comprise a first power transistor of PMOS type 120 in which the drain is connected to the first metal layer 106 and in which the source is connected to the element 114, and a first antiparallel power diode 122 connected between the source and the drain of the first transistor 120. The second components 112 comprise a second power transistor of NMOS type 124 in which the drain is connected to the second metal layer 110 and in which the source is connected to the element 114, and a second antiparallel power diode 126 connected between the source and the drain of the second transistor 124. The gates of the transistors 120, 124 are connected to the circuit 118, which is capable of controlling the switching of the transistors 120, 124.

The first antiparallel diode is generally integrated with the first power transistor and/or the second antiparallel diode is generally integrated with the second power transistor. It is nevertheless possible that the antiparallel diode(s) are separate components of the transistors.

The device 100 further comprises heat sinks 128, 130 arranged against the second main faces of the layers 106 and 110, opposite the first main faces on which are arranged the components 108, 112. These sinks 128, 130 make it possible to dissipate laterally the heat produced by the components 108, 112 (the lateral dissipation of heat is represented symbolically by horizontal arrows in FIG. 2).

Due to the fact that the stack is electrically connected to the metallizations 104 at a side or a lateral face, that is to say is arranged vertically on the support 102 or perpendicularly to the support 102, the occupied area of the stack on the support 102 is reduced compared to 3D assemblies of the prior art. This particular vertical arrangement of the stack forming the switching cell makes it possible to obtain a space saving on the support 102 compared to an assembly requiring lateral electric contacts on which the output signals are obtained.

With such a structure, the capacitor 116 carries out a filtering of differential mode perturbations generated by the switchings of the transistors 120 and 124, this filtering being carried out as near as possible to these transistors and thus to the source of these perturbations. The current circulation mesh between the capacitor 116 and the components 108, 112 forming the switching cell is thus reduced to the maximum, which reduces differential mode perturbations in the device 100.

In addition, this structure enables the elements located on either side of the lateral faces of the stack (the capacitor 116 and the circuit 118 in the example of FIG. 2) not to be subjected, or to be very little subjected, to the heat evacuated by the sinks 128, 130. The circuit 118 is also arranged as near as possible to the transistors of the switching cell which, on account of their horizontal arrangement, are arranged perpendicularly to this circuit 118. This arrangement makes it possible not to create electromagnetic couplings between the circuit 118 and the switches (here the transistors) of the switching cell.

Moreover, producing the components 108, 112 in the form of a 3D stack makes it possible, compared to a 2D assembly, to eliminate radiated mode perturbations.

In the example described previously, the device 100 comprises a switching cell formed by two MOS power transistors each being able to be optionally coupled to an antiparallel diode. These two transistors may be of complementary types (NMOS and PMOS) or the same NMOS type.

In an alternative embodiment, the switching cell may be produced with electronic power components other than those described previously, for example at least one NMOS power transistor (corresponding for example to the second component 112) connected to a power diode (corresponding for example to the first component 108).

A switching cell comprises at least two switches operating in a complementary manner, each switch being able to be controlled (MOS transistor, JFET, bipolar transistor, IGBT, thyristor, etc.) or not (power diode). The two switches of the switching cell may each correspond to a controlled switch coupled to an antiparallel diode.

The components 106, 108 may correspond to different types of components such as diodes, transistors of type JFET, MOSFET, IGBT, thyristors, and for example comprising silicon, silicon carbide, GaN or diamond.

The device 100 may comprise several switching cells similar to that described previously, produced on the support 102 and electrically connected together while forming a static converter (chopper, power inverter, rectifier or dimmer) or a polyphase converter (interleaved chopper for example).

Figure 4:
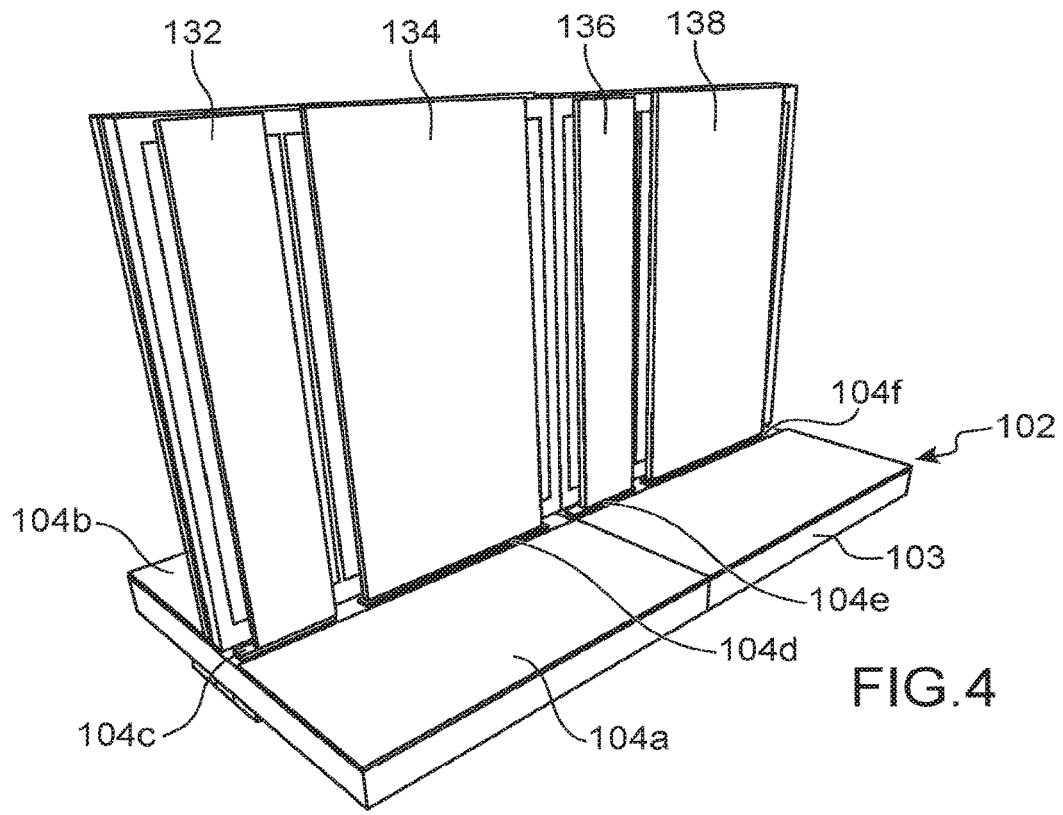
FIG. 4 schematically shows a three-dimensional view of two switching cells of an electronic power device.

FIG. 4 shows a three-dimensional view of two switching cells similar to that described previously in conjunction with FIGS. 2 and 3, and in section at the element 114. The element 114 comprises a first portion 132 in contact with the gates of the two transistors of a first of the two switching cells and arranged on the metallization 104c of the support 102, at the level of one of its lateral faces. The element 114 also comprises a second portion 134 in contact with the sources of the transistors of the first of the two switching cells and comprising one of its lateral faces arranged on a metallization 104d of the support 102. The element 114 comprises two other portions 136 and 138 connected in an analogous manner to the transistors of the second of the two switching cells and arranged on other metallizations 104e and 104f.

In the configuration shown in FIG. 4, each transistor comprises gate and source regions arranged next to each other and of substantially rectangular shape. The portions 132, 134, 136, 138 of the element 114 are arranged next to each other and are also of substantially rectangular shape.

The device 100 is advantageously produced by collective implementation steps carried out at the scale of the substrate and enabling the simultaneous production of several switching cells in the form of stacks intended to be arranged vertically on a metallized support. Such a method is described below in conjunction with FIGS. 5A to 5G.

Figure 5A:
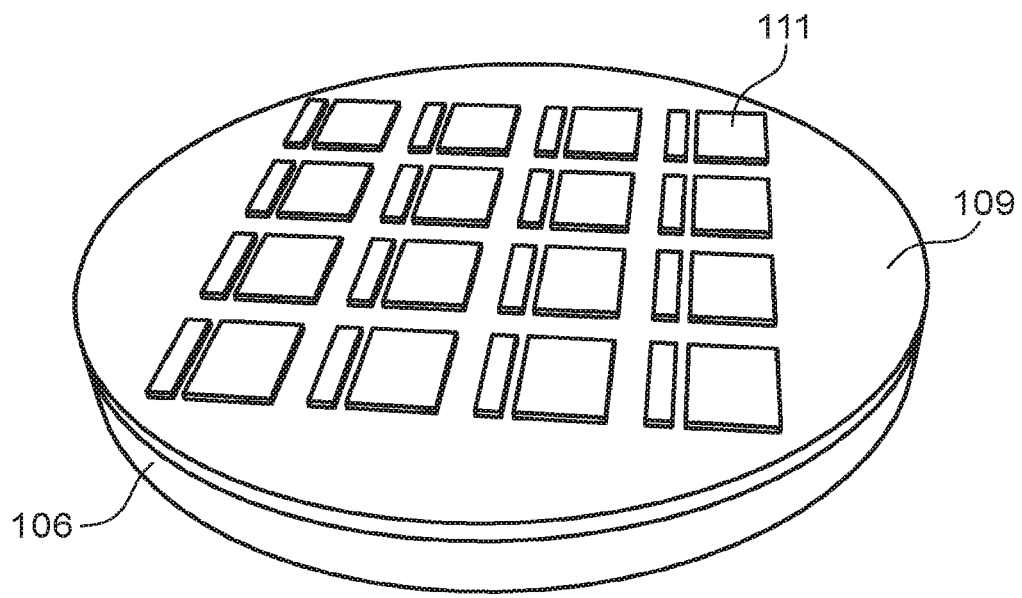
FIGS. 5A to 5G show the steps of a method for collectively producing several switching cells of an electronic power device, subject matter of the present invention.

The first components 108 of several switching cells, for example PMOS transistors, are produced from a first silicon substrate 109 transferred onto the first metal layer 106, here made of copper, forming a common electrode connected to the drains of the PMOS transistors. Copper metallizations 111, advantageously of rectangular shape, are produced on the gates and sources of the PMOS transistors (FIG. 5A).

Figure 5B:
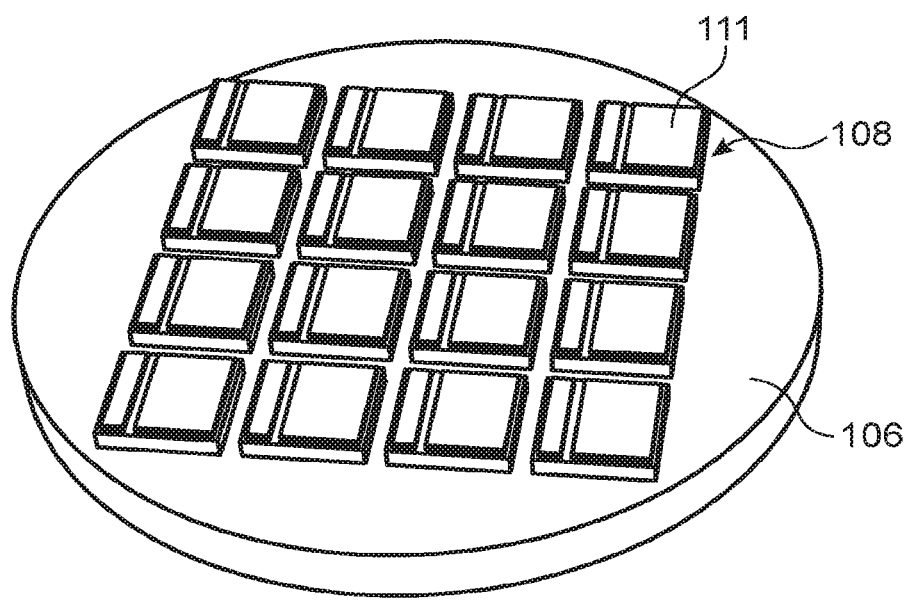

As shown in FIG. 5B, a step of islanding, comprising the deep etching of the first silicon substrate 109 until the first metal layer 106 is reached, is next implemented in order that the active zones of the PMOS transistors are insulated from each other. This step makes it possible to guarantee the voltage resistance of the first components 108 as well as the insulation between them at the gate and source regions.

Figure 5C:
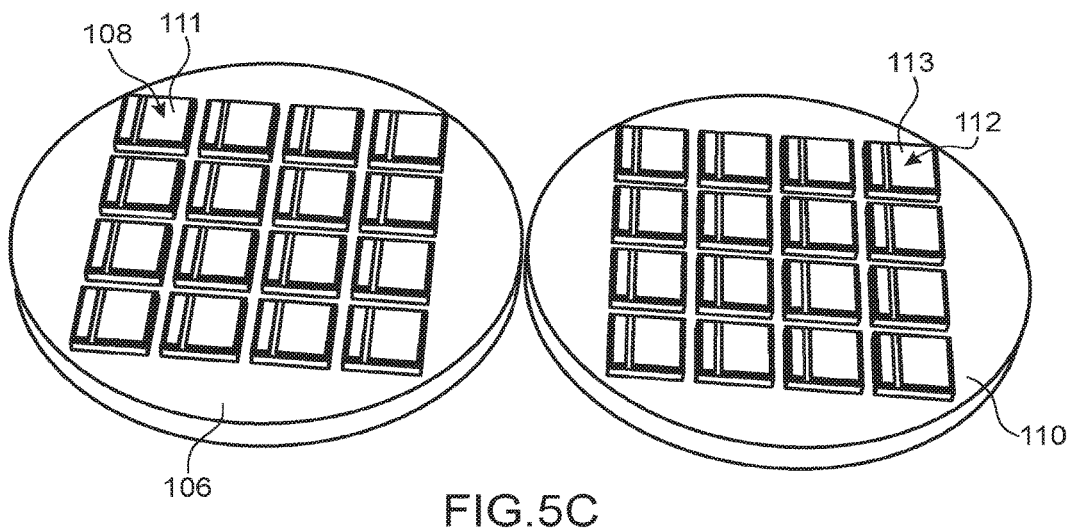

In parallel with the production of the first components 108, the second components 112, for example NMOS transistors, are produced on a second silicon substrate transferred onto the second metal layer 110, also made of copper, in an analogous manner to the first components 108. Copper metallizations 113 are produced on the gates and sources of the NMOS transistors. A step of islanding, comprising the deep etching of the second silicon substrate until the second metal layer 110 is reached, is next implemented in order that the active zones of the NMOS transistors are insulated from each other (FIG. 5C).

The components 108, 112 are vertical components for example produced over a height between around 30 µm and 1 mm. The semiconductor substrates used to produce the components 108, 112 may be thinned or not, and may comprise a semiconductor other than silicon according to the technology of the components 108, 112.

Figure 5D:
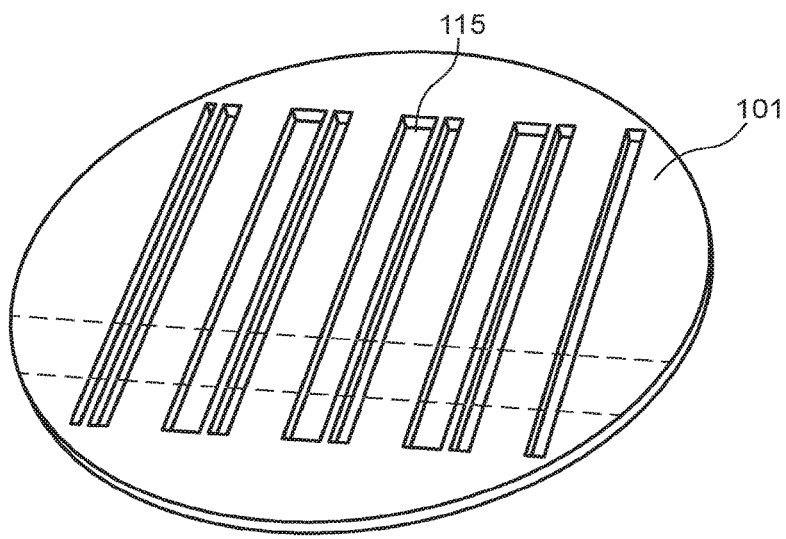

A structured metal layer 101, intended to form the electric contact elements 114 of the switching cells, is next produced, for example by machining of a copper disc of diameter equal to that of the wafers used for the production of the components 108, 112 (for example equal to around 200 mm) and of thickness for example equal to 300 µm, according to the patterns of the components in order to be able to separate for example the source and gate potentials of the transistors (FIG. 5D). This machining forms for example hollowing-outs 115 of rectangular shape through the layer 101, these hollowing-outs 115 making it possible to separate, in each electric contact element 114, the electrodes of the components on a vector of components which will be cut later once the assembly is made between this structured metal layer 101 and the components 108, 112 produced previously. This cutting will be for example carried out along a path substantially perpendicular to the largest dimension of the rectangles formed by the hollowing-outs 115, as indicated in dotted lines in FIG. 5D.

Figure 5E:
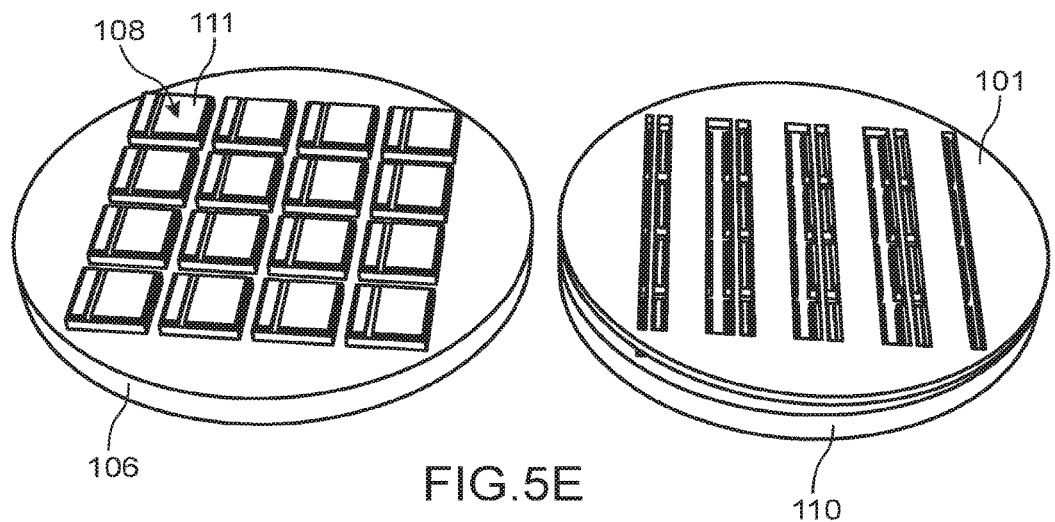
Figure 5F:
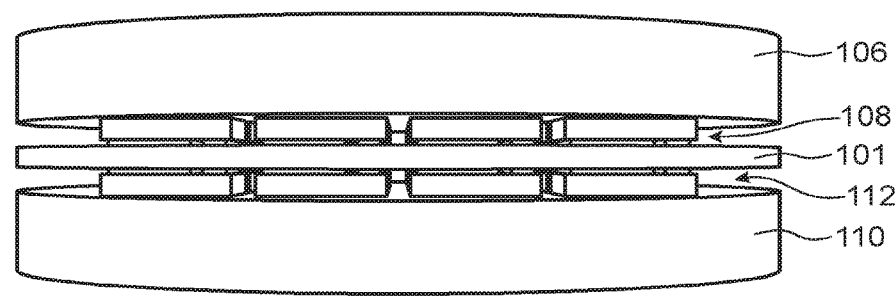

As shown in FIG. 5E, the structured metal layer 101 is next transferred, at the level of one of its two main faces, onto one of the assemblies of the first or second components 108, 112 (on the second components 112 in the example of FIG. 5E). The other components are next assembled on the other main face of the layer 101 (FIG. 5F).

A chip to chip assembly is thus carried out via metal bonding by thermo-compression or direct bonding on the two opposite main faces of the layer 101, that is to say the elements 114. The structure thereby obtained corresponds to several switching cells produced according to a collective full wafer method. The layer 101 achieves the full wafer interconnection of the potentials situated at the middle of the 3D stack obtained. The stack obtained is symmetrical with respect to the layer 101, and thus with respect to the elements 114, in order to favour the distribution of the mechanical stresses caused by differences between the heat expansion coefficients of silicon and copper.

The assembly thereby obtained forms the switching cells used for the production of electronic power devices 100 such as described previously.

Figure 5G:
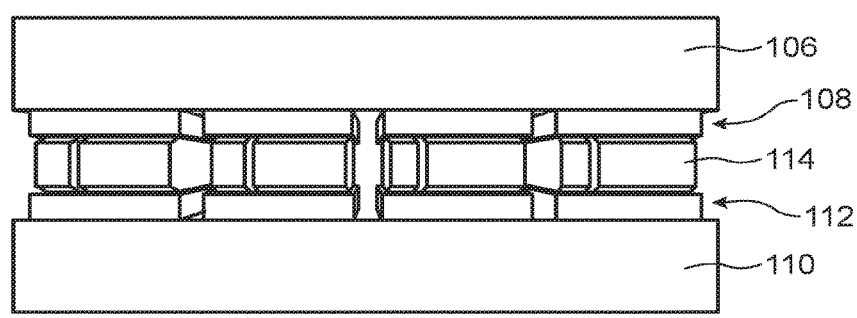

The switching cells are next cut individually or in the form of sets, or vectors, of switching cells arranged next to each other. FIG. 5G shows for example a vector of four switching cells (or four arms) each comprising a PMOS transistor and a NMOS transistor. Such a vector of four switching cells is for example used for producing a device 100 corresponding to an interleaved converter.

Given that the cutting is carried out after the assembly of the substrates comprising the components 108, 112 with the layer 101, the flanks, that is to say the lateral faces, of the different elements of the cut assembly are aligned and may thus be used to produce the interconnections between the switching cell(s) and the support 102, the contacts of the switching cell(s) being obtained on one of the edges of the cut assembly.

The stacks each comprising one or more switching cells are made integral with the metallizations 104 of the support 102 for example by brazing. The metallizations 104 have a thickness for example between around 10 μm and 300 μm, a width for example between around 300 μm and 500 μm, and the metallizations with which are made integral the portions of the element 114 are for example spaced apart from the metallizations with which are made integral the layers 106, 110 by a distance between around 50 μm and 100 μm. The decoupling capacitor(s) 116 are next assembled on the stack(s) produced, for example by brazing. Finally, the control circuit(s) 118 are transferred onto the rear face of the support 102.

The design of the electronic power components used is suited to the connection by the edge of the stack produced. Thus, in the examples described previously in conjunction with FIGS. 2 to 5, the transistors used each comprise, in a plane parallel to the main faces of the layers 106, 110, a gate which is not totally surrounded by the source. The patterns of the gate and the source of each transistor correspond for example to two rectangles arranged next to each other. During the collective production of these transistors, prior to the cutting of the structure, all the gates of the transistors arranged on a same column may be electrically connected together by a metal portion of the layer 101, and all the sources of these transistors may be electrically connected together by another metal portion of the layer 101. It is only once the stack has been assembled that the transistors are then cut and are insulated from each other.

Figure 6:
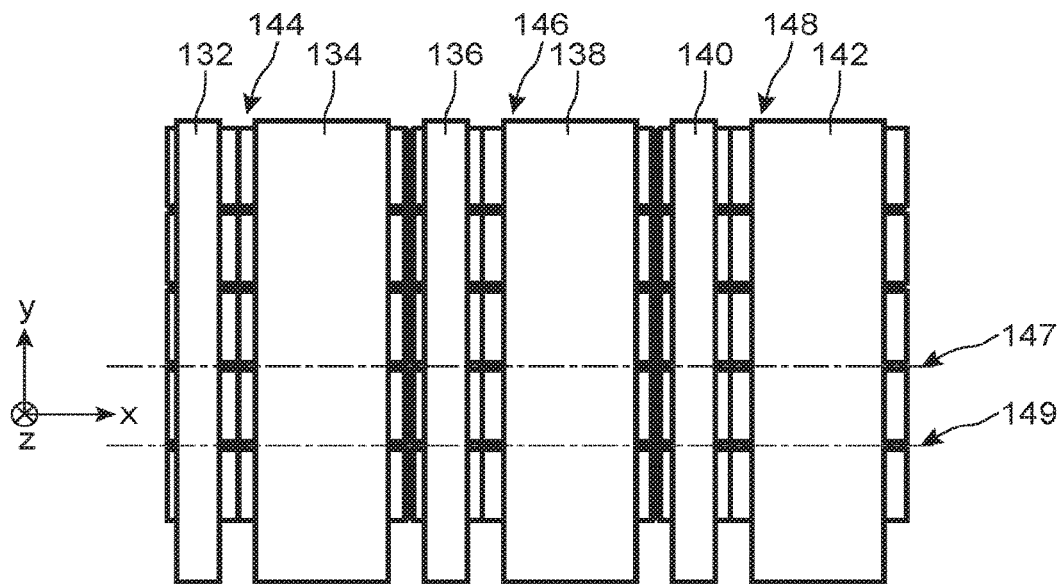
FIG. 6 schematically shows several sets of transistors used for the production of switching cells of electronic power devices.

FIG. 6 schematically shows several sets 144, 146 and 146 of transistors produced collectively on a same substrate, the transistors of each of these sets 144, 146 and 148 being arranged in a column. Each of the metal portions 132 to 142 of the structured metal layer 101 connects the gates or the sources of the transistors of one of the sets 144, 146 and 148. The dotted lines 147, 149 shown in FIG. 6 correspond to cutting lines making it possible to insulate the transistors of each of the sets with respect to each other. In the example of FIG. 6, the cuts produced form sets of three transistors arranged next to each other. The number of transistors of each set is chosen as a function of the needs for producing the device 100. For the production of a converter, for example polyphase, the cutting of the sets of transistors may be carried out by choosing a number of transistors arranged next to each other along the X axis shown in FIG. 6 as a function of the number of switching cells of the converter. In addition, within each set of transistors, the number of transistors conserved in each column, that is to say along the Y axis shown in FIG. 6, and in which the gates and sources are connected by one of the metal portions 132-134, may be chosen as a function of the desired current rating of the converter.

Figure 7A:
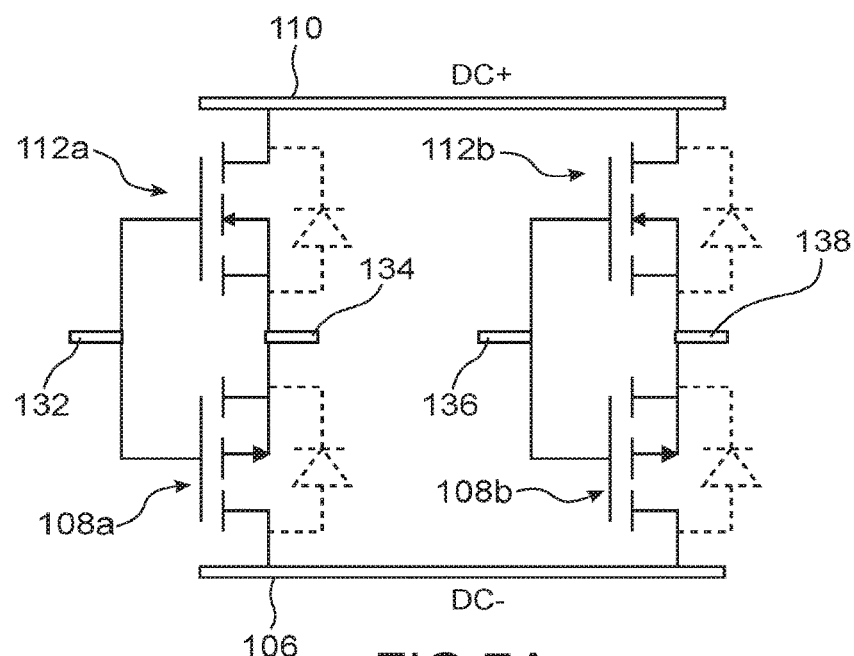
FIG. 7A shows the electrical diagram of two switching cells produced according to a collective method, subject matter of the present invention, of an electronic power device.

FIG. 7A shows the electrical diagram of two switching cells produced according to a collective method such as described previously in conjunction with FIGS. 5A to 5G, according to a first exemplary embodiment, and for example intended to form part of a same electronic power device 100. FIG. 7B is a schematic front view of the edge of the stack forming these two switching cells and which is intended to be connected to the support 102. FIG. 7C shows the face of the support 102 comprising the metallizations 104 intended to be connected to the switching cells.

The first switching cell comprises a power transistor of PMOS type 108a coupled to a NMOS transistor 112a in an analogous manner to the transistors forming the switching cell described previously in conjunction with FIG. 3. The negative supply potential DC− of the switching cells is applied to the drain of the PMOS transistor 108a via the first metal layer 106, which is electrically connected to the drain of the PMOS transistor 108a through a metallization 117. The gate and the source of the PMOS transistor 108a are connected respectively to the gate and to the source of the NMOS transistor 112a via the metal portions 132 and 134 of the electric contact element 114. The gate and the source of the PMOS transistor 108a are connected respectively to the portions 132 and 134 of the element 114 by the metallizations 111. Similarly, the gate and the source of the NMOS transistor 112a are connected respectively to the portions 132 and 134 of the element 114 by the metallizations 113. The positive supply potential DC+ of the switching cells is applied to the drain of the NMOS transistor 112a via the second metal layer 110, which is connected to the drain of the NMOS transistor 112a through a metallization 119.

The second switching cell comprises a power transistor of PMOS type 108b coupled to a NMOS transistor 112b in an analogous manner to the transistors forming the first switching cell described previously. The negative supply potential DC− is applied to the drain of the PMOS transistor 108b via the first metal layer 106 (which is common to the two switching cells), which is connected to the drain of the PMOS transistor 108b through a metallization 117. The gate and the source of the PMOS transistor 108b are connected respectively to the gate and the source of the NMOS transistor 112b via the metal portions 136 and 138 of the element 114. The gate and the source of the PMOS transistor 108b are connected respectively to the portions 136 and 134 of the element 114 by the metallizations 111. Similarly, the gate and the source of the NMOS transistor 112b are connected respectively to the portions 136 and 138 of the element 114 by the metallizations 113. The positive supply potential DC+ is applied to the drain of the NMOS transistor 112b via the second metal layer 110 (common to the two switching cells), which is connected to the drain of the NMOS transistor 112b through a metallization 119.

In an alternative embodiment, one or more of the transistors 108a, 108b, 112a and 112b may be coupled to antiparallel diodes (such diodes are shown in dotted lines in FIG. 7A).

The face of the stack shown in FIG. 7B is transferred onto the metallizations 104 of the support 102 shown in FIG. 7C. The length (dimension along the X axis shown in FIG. 7C) occupied by the metallizations 104 on the support 102 is for example between around 100 μm and 1 mm for the gate pad and 2 mm and 5 mm for the source pad, and for example equal to around 1 cm for the support 102.

Figure 8A:
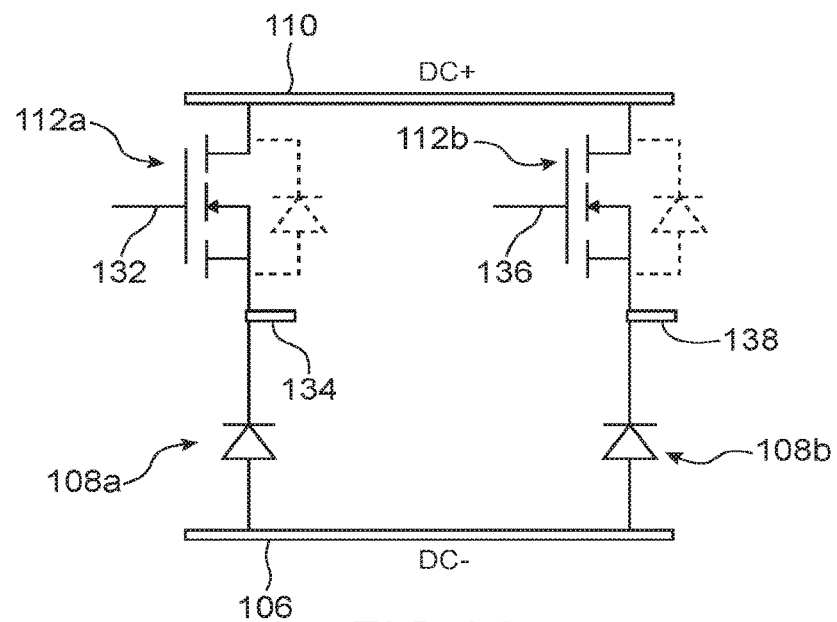
FIG. 8A shows the electrical diagram of two switching cells produced according to a collective method, subject matter of the present invention, of an electronic power device.
Figure 8B:
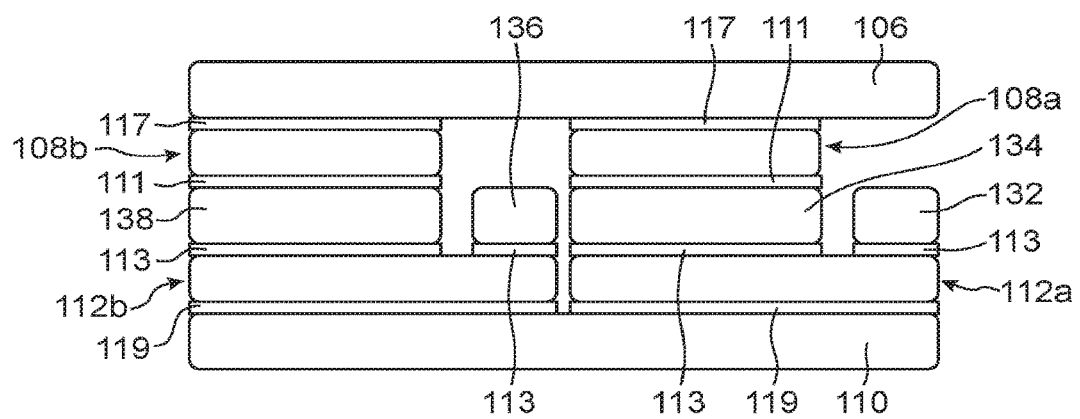
FIG. 8B is a schematic front view of the edge of the stack forming the two switching cells of FIG. 8A, which is intended to be connected to the support.

FIG. 8A shows the electrical diagram of two switching cells produced according to the collective method described previously in conjunction with FIGS. 5A to 5G, according to a second exemplary embodiment and for example intended to form part of a same electronic power device 100. FIG. 8B is a front view of the edge of the stack forming these two switching cells and which is intended to be connected to the support 102.

The first switching cell comprises a power diode 108a coupled, via its cathode, to a NMOS transistor 112a. The negative supply potential DC− is applied to the anode of the diode 108a via the first metal layer 106, which is connected to the anode of the diode 108a through a metallization 117. The cathode of the diode 108a is connected to the source of the NMOS transistor 112a via the metal portion 134 of the element 114. The cathode of the diode 108a is connected to the portion 134 by one of the metallizations 111. The gate and the source of the NMOS transistor 112a are connected respectively to the portions 132 and 134 of the element 114 by the metallizations 113. The positive supply potential DC+ is applied to the drain of the NMOS transistor 112a via the second metal layer 110, which is connected to the drain of the NMOS transistor 112a through a metallization 119.

The second switching cell comprises a power diode 108b coupled, via its cathode, to a NMOS transistor 112b. The negative supply potential DC− is applied to the anode of the diode 108b via the first metal layer 106, which is connected to the anode of the diode 108b through a metallization 117. The cathode of the diode 108b is connected to the source of the NMOS transistor 112b via the portion 134 of the element 114. The cathode of the diode 108b is connected to the portion 134 of the element 114 by one of the metallizations 111. The gate and the source of the NMOS transistor 112b are connected respectively to the portions 132 and 134 of the element 114 by the metallizations 113. The positive supply potential DC+ is applied to the drain of the NMOS transistor 112b via the second metal layer 110, which is connected to the drain of the NMOS transistor 112b through a metallization 119.

One or more of the transistors 112a and 112b may be coupled to the antiparallel diodes (shown in dotted lines in FIG. 8A).

In each of the switching cells, the diode is produced such that its area (in the plane of the substrate on which it is produced) is close to that of the NMOS transistor of the switching cell of which it forms part. This makes it possible to facilitate the assembly of the stack on the support 102 thanks for example to the similar dimensions of the metallization 111 connecting the cathode of the diode to the element 114 and the metallization 113 connecting the source of the NMOS transistor to the element 114, as shown in FIG. 8B. This implies an over-dimensioning of the diode vis-à-vis the transistor (for a same current rating, the diode, which is a bipolar component, has a smaller area than the MOS transistor, which is for its part a unipolar component).

The face of the stack shown in FIG. 8B is transferred onto the metallizations 104 of the support 102, which are configured in an analogous manner to those shown in FIG. 7C.

In the example shown in FIG. 8B, the sides of the portions 132 and 136 located facing the first metal layer 106 are not mechanically connected to this first layer 106. Nevertheless, due to the fact that the area of the gates of the transistors 112a, 112b is less than that of the sources of the transistors 112a, 112b, this does not impact the correct distribution of thermo-compression forces during the assembly carried out to form these stacks.

This second exemplary embodiment is advantageously implemented using components of same type, for example bipolar components such as PN diodes and IGBT transistors, or unipolar components such as MOSFET or JFET transistors and Schottky diodes comprising SiC.

Figure 9A:
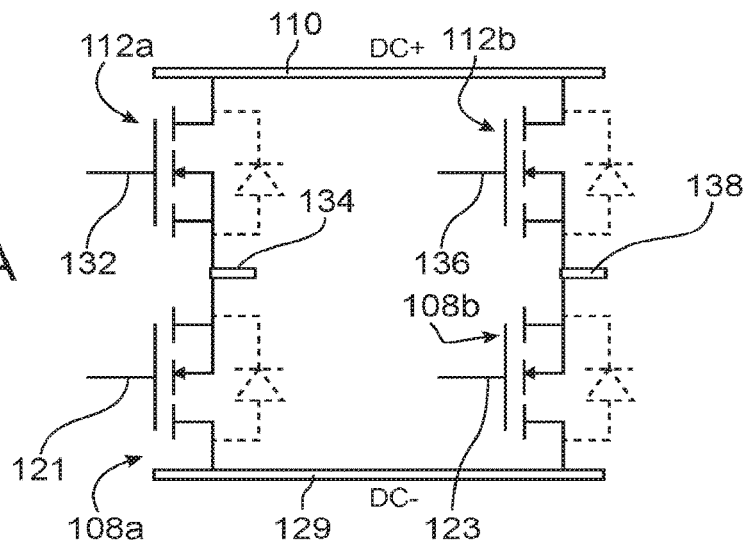
FIG. 9A shows the electrical diagram of two switching cells produced according to a collective method, subject matter of the present invention, of an electronic power device.
Figure 9B:
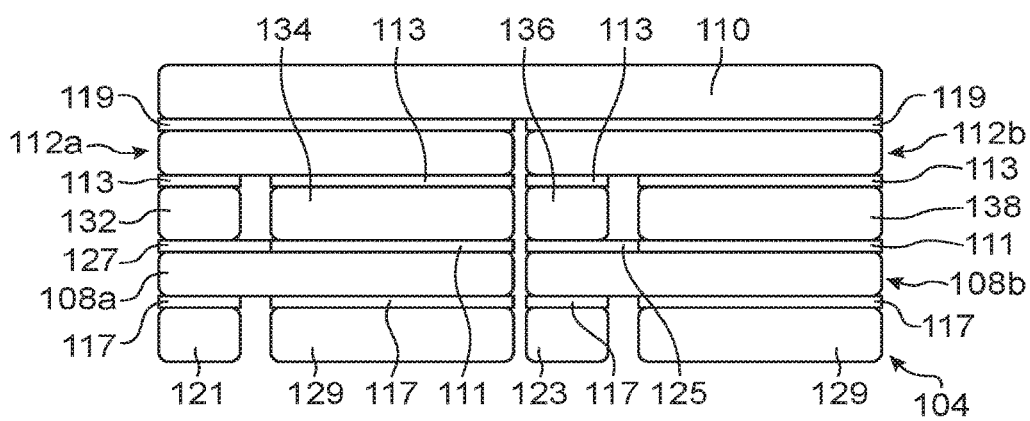
FIG. 9B is a schematic front view of the edge of the stack forming the two switching cells of FIG. 9A, which is intended to be connected to the support.

FIG. 9A shows the electrical diagram of two switching cells produced according to the collective method previously described in conjunction with FIGS. 5A to 5G, according to a third exemplary embodiment, and for example intended to form part of a same electronic power device 100. FIG. 9B is a front view of the edge of the stack forming these two switching cells, which is intended to be connected to the support 102, and FIG. 9C shows the face of the support 102 comprising the metallizations 104 intended to be connected to the switching cells.

In this third exemplary embodiment, each of the components 108a, 108b, 112a, 112b corresponds to a NMOS transistor, each switching cell being formed by two NMOS transistors coupled to each other. In this configuration, the control of the transistors within a switching cell is not common (unlike the case described previously in conjunction with FIGS. 7A-7C) because the transistors are not of complementary types. This third exemplary embodiment thus resorts to two additional electrodes connected to the gates of the transistors 108a and 108b. Such an assembly may be produced by resorting to two separate electric contact elements. One of the two elements, corresponding to the element 114, is arranged between the first and second components and comprises the portions 132, 134, 136 and 138 as in the first exemplary embodiment. The gates of the transistors 108a, 108b are not electrically connected to the portions 132 and 136 but are electrically insulated therefrom by dielectric portions 125 and 127, for example comprising oxide. The other of the two electric contact elements forms the first metal layer 106 and comprises the portions 121, 123 and 129 insulated from each other and connected to the sources and gates of the transistors 108a, 108b.

One or more of the transistors 108a, 108b, 112a and 112b may be coupled to antiparallel diodes (represented in dotted lines in FIG. 9A).

Figure 9C:
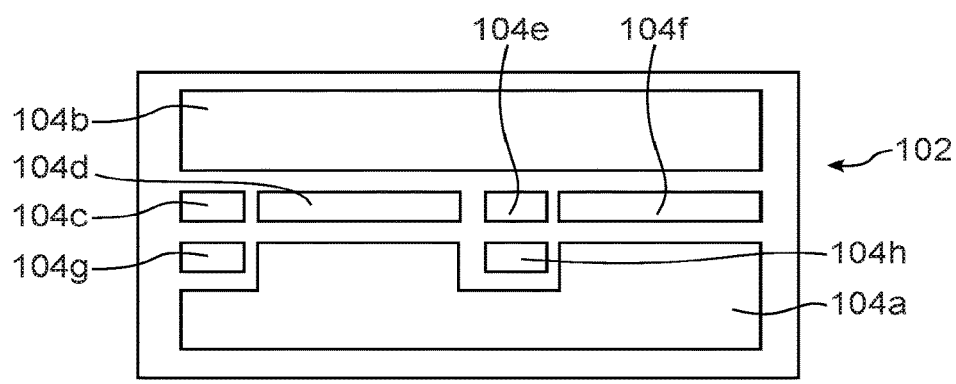
FIG. 9C shows the face of the support comprising the metallizations intended to be connected to the switching cells of FIG. 9A.

The face of the stack shown in FIG. 9B is transferred onto the metallizations 104 of the support 102 shown in FIG. 9C and which comprise, compared to those described previously in conjunction with FIG. 7C, two additional metallizations 104g and 104h intended to be connected to the gates of the transistors 108a, 108b.

Figure 10:
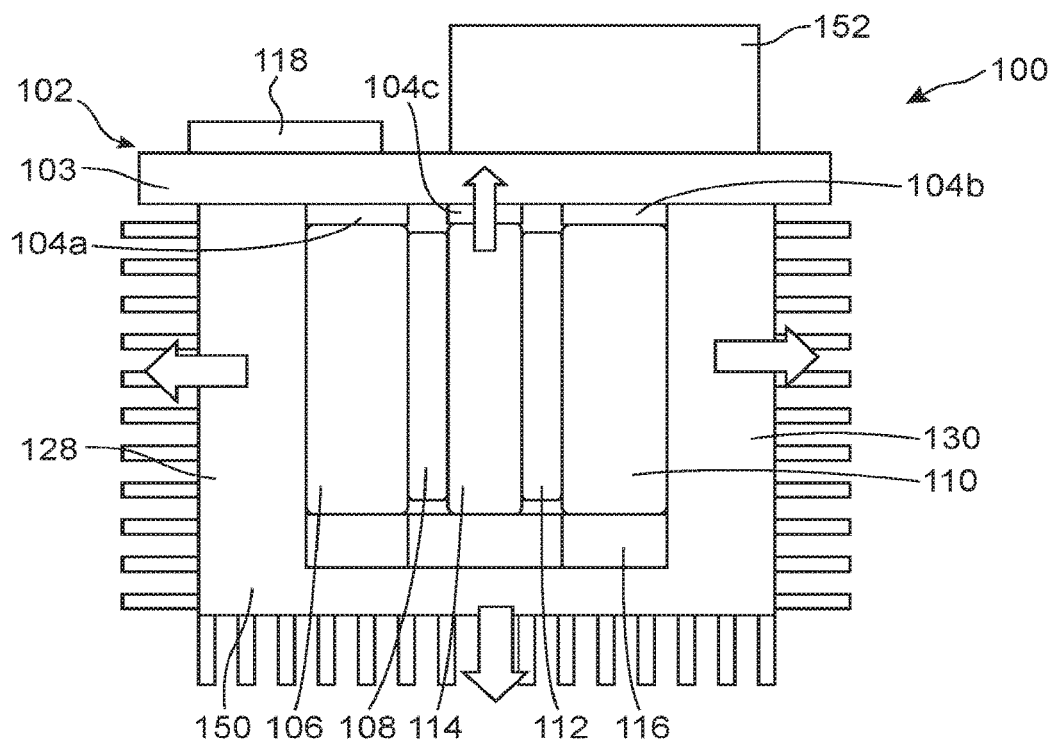
FIG. 10 schematically shows an electronic power device according to a second embodiment.

FIG. 10 shows an electronic power device 100 according to a second embodiment.

As in the first embodiment, the device 100 comprises the support 102, the metallizations 104, the metal layers 106, 110, the components 108, 112, the element 114, the capacitor 116 and the circuit 118.

In this second embodiment, the heat sinks 128, 130 arranged against the layers 106, 110 form a package in which the stack forming the switching cell(s) is arranged. This package also comprises a part 150 corresponding to an additional heat sink and forming the bottom of the package. This part 150 is arranged against the capacitor 116 and contributes to the dissipation of heat produced by the components 108, 112. The sinks 128, 130 and 150 form a heat dissipation block, also playing a role of mechanically maintaining the stack on the support 102.

Elements 152 serving for the conversion of energy carried out by the module 100 are arranged on the rear face of the support 102. These elements 152 are for example inductances and/or energy transformation elements (interleaved or not) and are connected to the components 108, 112 through power interconnections (not shown in FIG. 10) produced through the support 102. The arrangement of the elements 152 at the rear face of the support 102 and not within the stack makes it possible to reduce the area of the mid-point, which is a source of common-mode perturbations.

Other control elements, for example of DSP or FPGA type, may be arranged at the rear face of the support 102.

Such a package of press-pack type may be advantageously used for the production of high power converters.

Whatever the embodiment of the device 100, it is possible to integrate a circuit for circulating a heat transfer fluid, notably when the device 100 comprises sets of several switching cells.

Moreover, an electrical insulator may be arranged between the second main faces of the layers 106, 110 and the heat sinks 128, 130, notably for the second embodiment described previously and when the heat sinks 128, 130 are electrically conducting, in order not to short-circuit the components 108, 112.

Figure 11:
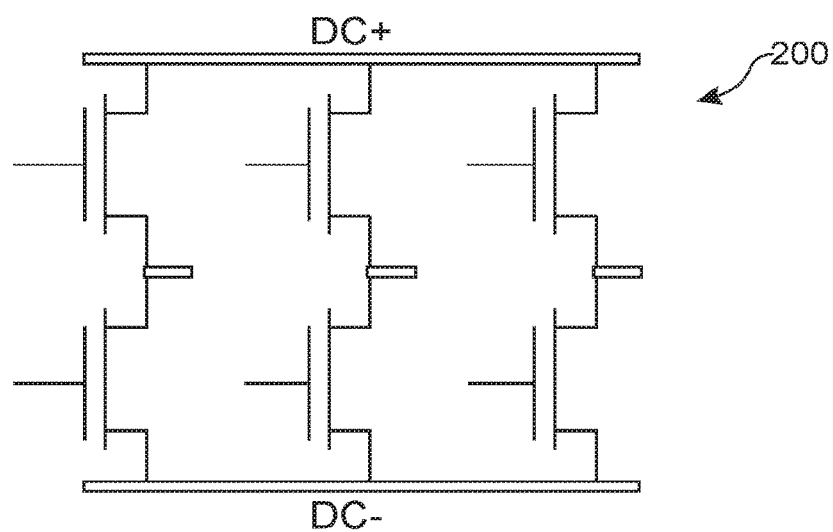
FIG. 11 shows an electrical diagram of an exemplary embodiment of a static converter, subject matter of the present invention.

FIG. 11 shows the electrical diagram of an exemplary embodiment of a static converter 200 produced with an electronic power device such as described previously. This static converter 200 correspond here to a three-phase inverter formed by an electronic power device comprising three switching cells (each cell forming an arm of the converter), and for example used for the supply and the control of three-phase motors. Each arm is formed by two transistors, for example as in the examples described previously in conjunction with FIG. 3, 7 or 9.

In the embodiments and exemplary embodiments described previously, the components of the device 100 correspond to vertical power components, or to a vertical structure, that is to say components in which the electric current flows in a vertical manner, substantially perpendicularly to the substrates on which these components are produced. In an alternative embodiment, the components may correspond to lateral power components, or to a lateral structure, for example made of silicon on SOI (Silicon On Insulator) of LDMOS (Lateral Diffused MOS) type or transistors comprising GaN, for example of HEMT (High Electron Mobility Transistor) type, that is to say components in which the electric current flows substantially parallel to the substrates from which these components are produced.

Figure 28:
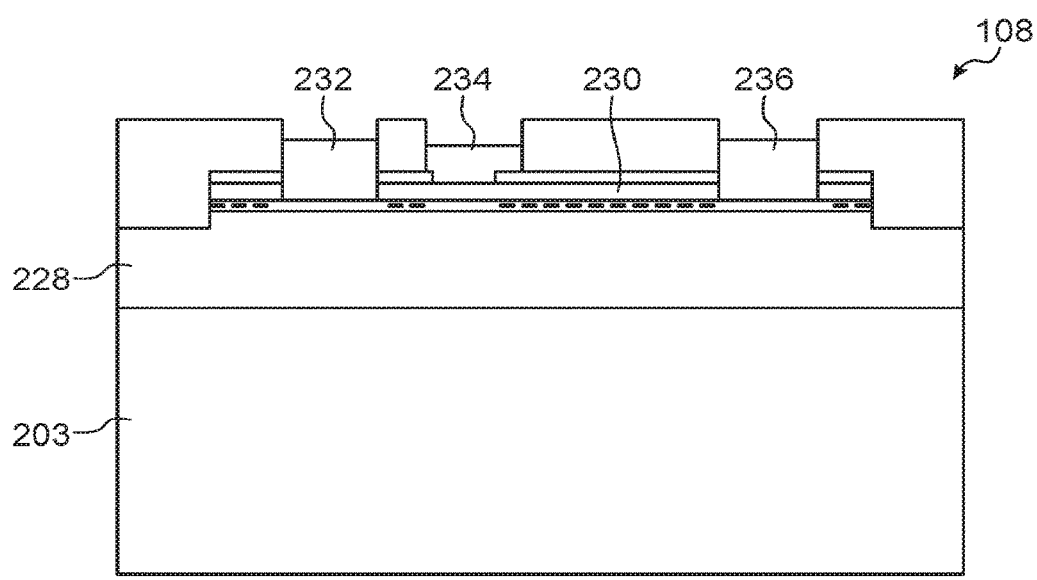
FIG. 28 shows an exemplary embodiment of a lateral power component.

An exemplary embodiment of such a power component with lateral structure is shown in FIG. 28. In this figure, the lateral power component corresponds to a power transistor 108 of HEMT type comprising GaN. This transistor 108 is formed on a silicon substrate 203 in which the thickness is for example between around 725 μm and 1000 μm. The active part of the power transistor 108 is formed from a layer of GaN 228 on which is arranged a layer 230 of AlGaN in which are produced the channel, source and drain regions of the transistor 108. Electrodes 232, 234 and 236 form respectively the source, gate and drain electrodes of the transistor 108.

The use of such components is possible thanks to the structure of the device 100 which forms around the components an optimised packaging with regard to EMC, making it possible to limit the parasitic inductances of loops (because such components can switch faster than those produced using vertical semiconductor technology), and also optimised for the thermal aspects (the power density with components comprising GaN is greater than the equivalent made of silicon because these components have smaller dimensions at equal current rating).

FIGS. 12A-12C show the steps of an assembly of lateral components for producing an electronic power device 100 comprising a switching cell formed by two transistors.

As shown in FIG. 12A, a first transistor 108 is produced from a first silicon substrate 203 and comprises, at a front face, a first metallization 202 connected to the gate of the transistor 108, a second metallization 204 connected to the drain of the transistor 108 and a third metallization 206 connected to the source of the transistor 108. A second transistor 112 is produced from a second silicon substrate 205 and comprises, at a front face, a first metallization 208 connected to the gate of the transistor 112, a second metallization 210 connected to the source of the transistor 112 and a third metallization 212 connected to the drain of the transistor 112.

The electric contact element 114 used for the assembly of the two transistors 108, 112 to form the switching cell here comprises five separate portions: a first portion intended to be in contact with the metallization 202, a second portion intended to be in contact with the metallization 204, a third portion intended to be in contact with the metallization 208, a fourth portion intended to be in contact with the metallization 210, and a fifth portion intended to be in contact with the metallizations 206 and 212 (these two metallizations being produced such that they are located facing each other during the assembly of the two transistors 108, 112 to the element 114). As shown in FIG. 12B, a first main face of the element 114 is assembled on one of the two transistors 108, 112.

A second main face of the element 114, opposite its first main face, is assembled on the other of the two transistors 108, 112 (FIG. 12C). Thus, as for the devices 100 described previously, all the contacts of the components 108, 112 of the switching cell are located on one of the edges, or lateral faces, of the assembly produced. The mid-point of the switching cell produced is located on the fifth portion of the element 114, which is connected both to the source of the transistor 108 and to the drain of the transistor 112.

Here, all the electrodes of the first and second components 108, 112 of the switching cell are connected to the electric contact element 114 arranged between the components 108, 112.

Two levels of metallizations arranged in inter-metal dielectric layers (ILD) are for example produced on the active zones of each of the components for producing the electrodes of these components. The metallizations 202-212 correspond to the second level of metallizations. This second level may comprise additional metallizations with respect to the metallizations 202-212 in order that the portions of the element 114 are all in contact with portions of metal at the level of the two components 108, 112. These additional metallizations are not on the other hand electrically connected to the active zones of the components 108, 112 and serve only to obtain a good mechanical assembly of the stack. Thus, the portions of the element 114 located against the front face of one of the transistors 108, 112, but which are not intended to be electrically connected to this transistor, are in contact with the metallizations which are electrically insulated from the other connection levels of the transistor by a dielectric layer ILD. These portions are not electrically connected to the active zone of the transistor. This configuration makes it possible to spread out properly the mechanical stresses during the assembly of the device 100.

Figure 13:
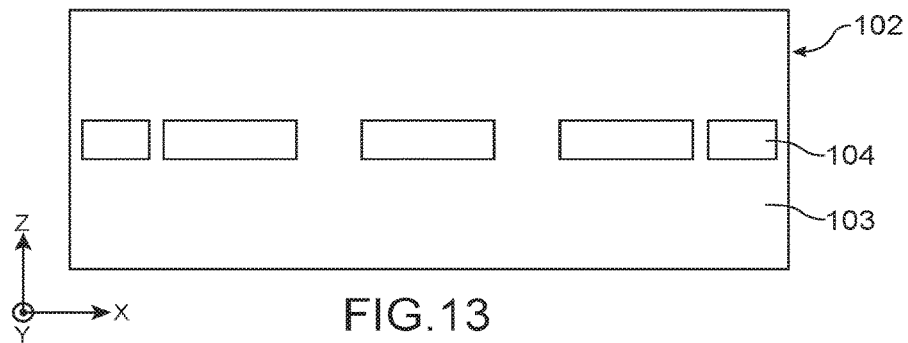
FIG. 13 shows the face of the support comprising the metallizations intended to be connected to the switching cell of FIG. 12C.

FIG. 13 shows the metallizations 104 of the support 102 intended to receive such an assembly. In this configuration, the metallizations 104 are aligned next to each other along an axis (parallel to the X axis in FIG. 13). The width of the metallizations (dimension parallel to the Z axis shown in FIG. 13) is for example between around 300 and 500 μm) and the length (dimension along the X axis) occupied by the metallizations 104 on the support 102 is for example between around 50 μm and 200 μm for the gate pad, and 400 μm and 1 mm for the source pad. The total length of the support 102 is for example equal to around 3.3 mm.

Figure 14:
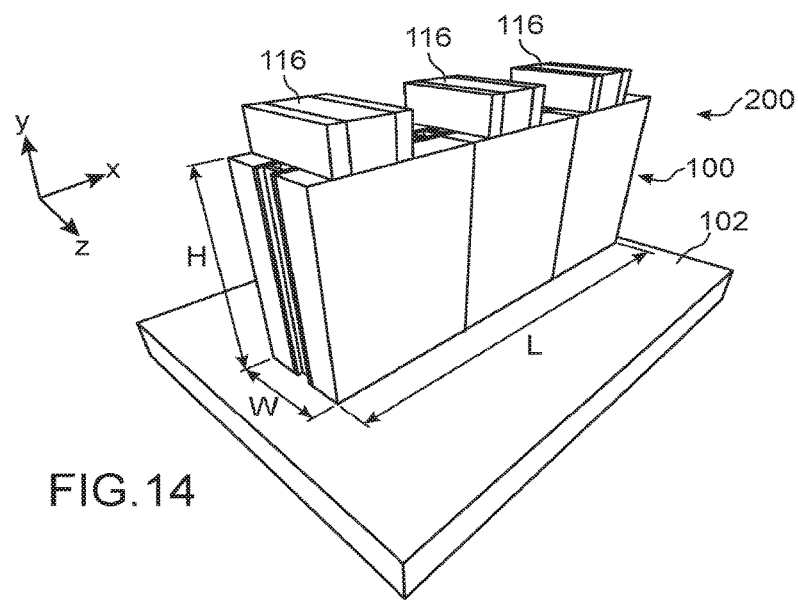
FIG. 14 schematically shows a static converter, subject matter of the present invention, according to another exemplary embodiment.

FIG. 14 schematically shows a static converter 200 produced from an electronic power device 100 comprising lateral power components such as described previously. This static converter 200 here corresponds to a three-phase inverter formed by a device 100 comprising three switching cells, each cell forming an arm of the converter. Each of the arms of the converter 200 is coupled to a decoupling capacitor 116. The height H (dimension along the Y axis) of the stack forming the switching cells is for example between around 3 mm and 5 mm and for example equal to around 4.4 mm. The width W (dimension along the Z axis) of the stack is for example between around 1 mm and 3 mm according to the thickness of the substrate on which the components are produced, and for example equal to around 2 mm. The length L (dimension along the X axis) of the stack is for example between around 0.5 cm and 2 cm according to the current rating of the components and is for example equal to around 1 cm.

Figure 15:
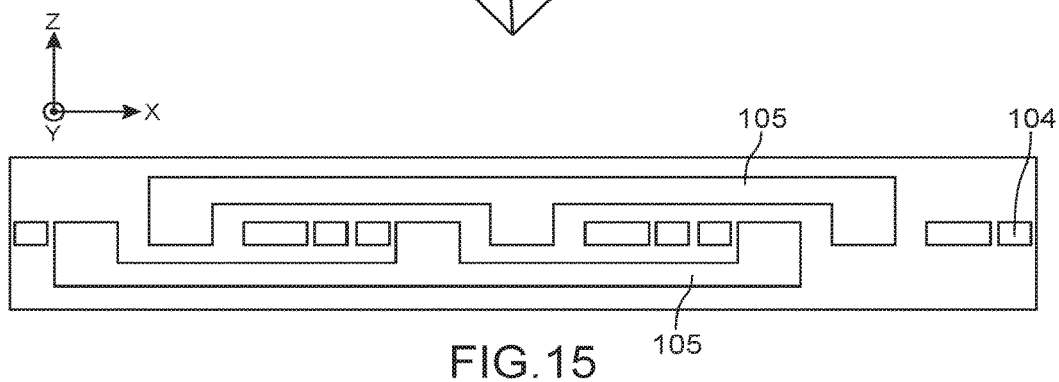
FIG. 15 shows the face of the support comprising the metallizations intended to be connected to the switching cells of the converter of FIG. 14.

FIG. 15 shows the metallizations 104 of the support 102 intended to receive such an assembly of the components of the converter 200 described previously in conjunction with FIG. 14. These metallizations 104 are aligned along the X axis, as for the example of FIG. 13 described previously, due to the fact that in the stack forming the three switching cells, all the electrodes of the components are connected to the element 114 arranged between the components 108, 112 of the cells. Metal tracks 105 are also present on the support 102 to connect together the metallizations intended to receive the electrical supply potentials from the switching cells.

Figure 16A:
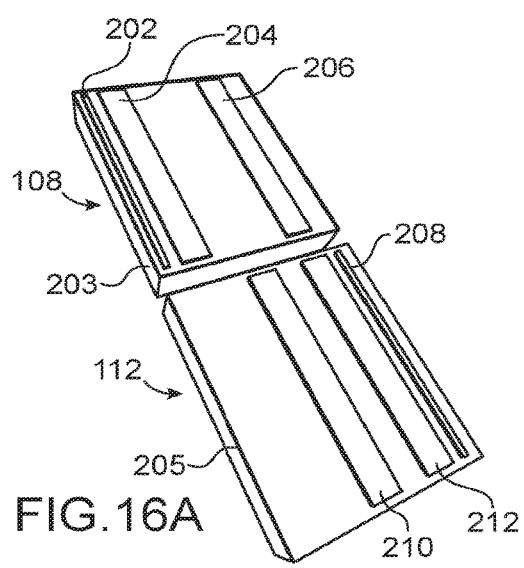
FIGS. 16A-16C show the steps of producing an electronic power device according to another exemplary embodiment.
Figure 16B:
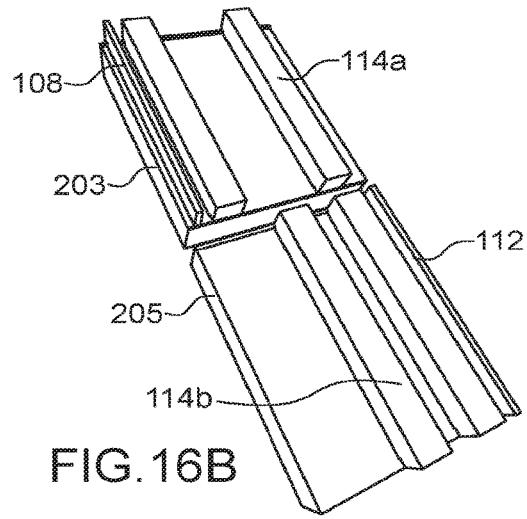
Figure 16C:
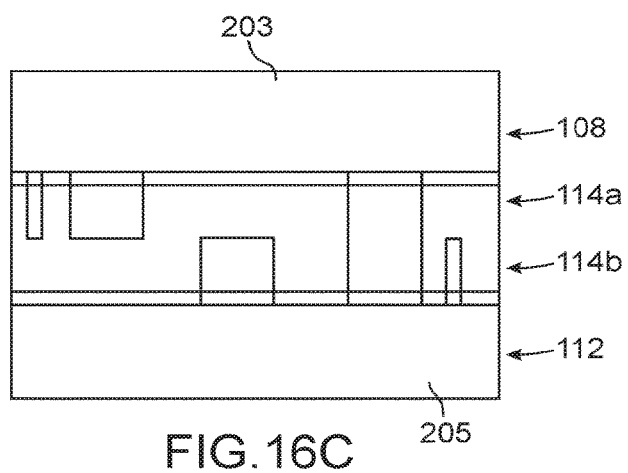

FIGS. 16A-16C show the steps of an assembly of lateral components for producing an electronic power device 100 comprising a switching cell formed by two transistors, according to an alternative embodiment of the method described previously in conjunction with FIGS. 12A-12C.

As shown in FIG. 16A, the transistors 108 and 112 are firstly produced from two semiconductor substrates, in an analogous manner to that described previously in conjunction with FIG. 12A.

Two separate electric contact elements 114a, 114b are next produced, each on one of the two components 108, 112 (FIG. 16B). Each of the electric contact elements 114a, 114b comprises portions each connected to one of the electrodes of the components 108, 112.

The components 108, 112 are next assembled together such that the elements 114a, 114b are arranged facing each other. The joining of the two elements 114a, 114b forms the electric contact element of the switching cell. In the example shown in FIG. 16C (view of the lateral face of the stack intended to be in contact with the support 102), one of the portions of each of the elements 114a, 114b are arranged against each other, here to form the mid-point of the switching cell. The other portions of the elements 114a, 114b are insulated from the component located facing them by a dielectric, for example in the form of an encapsulation gel (underfill) in order to improve the mechanical maintaining obtained because the contact area between the components 108, 114 and the element 114 is smaller than in the case of the method described previously in conjunction with FIGS. 12A-12C.

The use of two separate elements 114a, 114b during the production of the assembly has the advantage of moving away the metal portions not common to the two components vis-à-vis the component not contacted by these portions, which improves the electrical insulation of these portions vis-à-vis the component to which these portions are not electrically connected.

Figure 17:
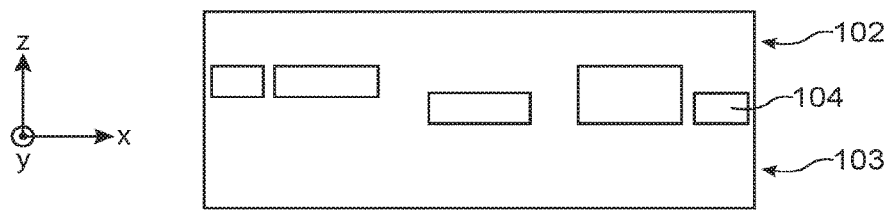
FIG. 17 shows the face of the support comprising the metallizations intended to be connected to the switching cell of FIG. 16C.

FIG. 17 shows the metallizations 104 of the support 102 intended to receive such an assembly. The arrangement of these metallizations 104 corresponds to the arrangement of the metal portions of the elements 114a, 114b shown in FIG. 16C.

Figure 18:
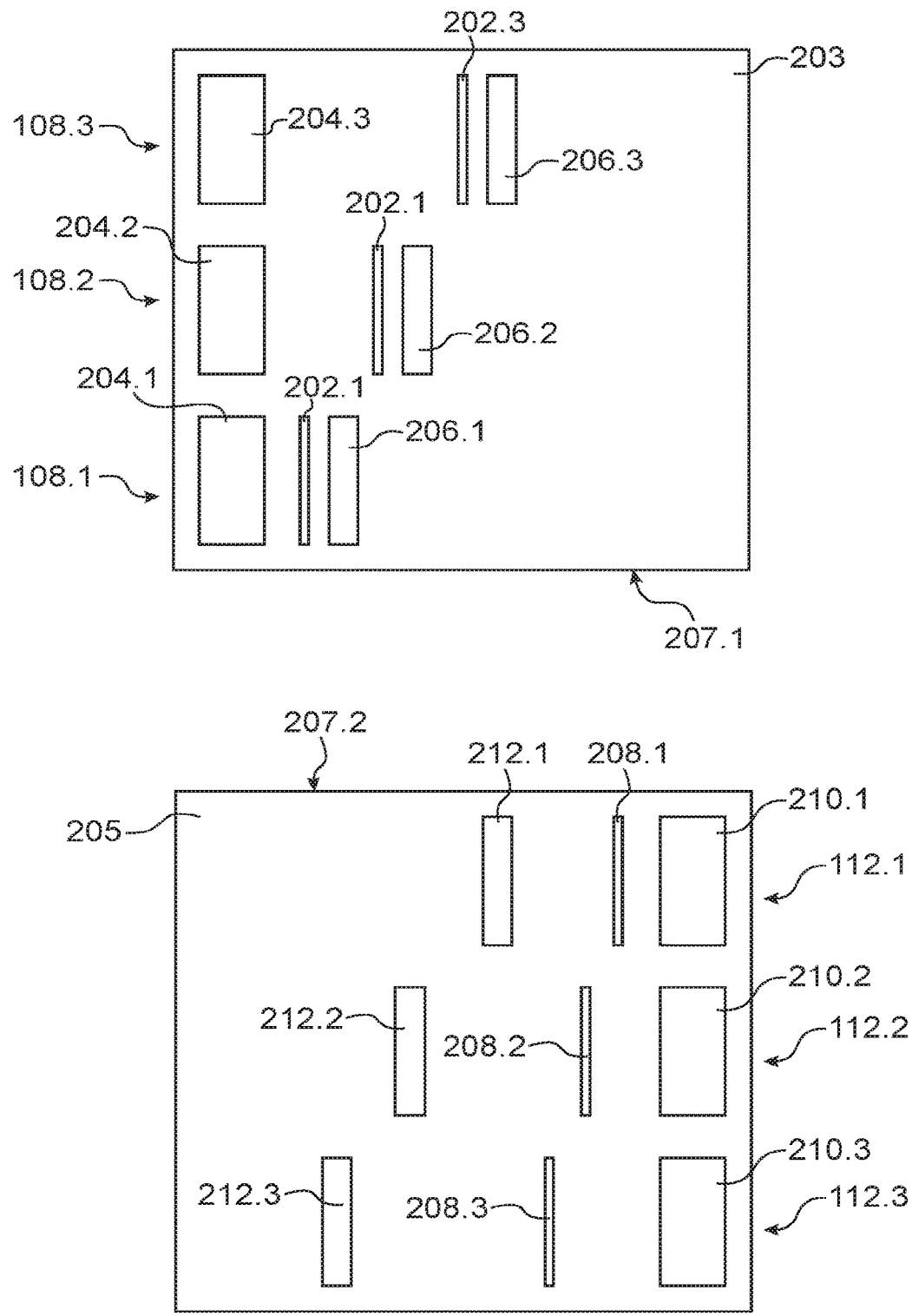
FIGS. 18 to 20 show the elements of an electronic power device, subject matter of the present invention, according to another alternative embodiment.
Figure 19:
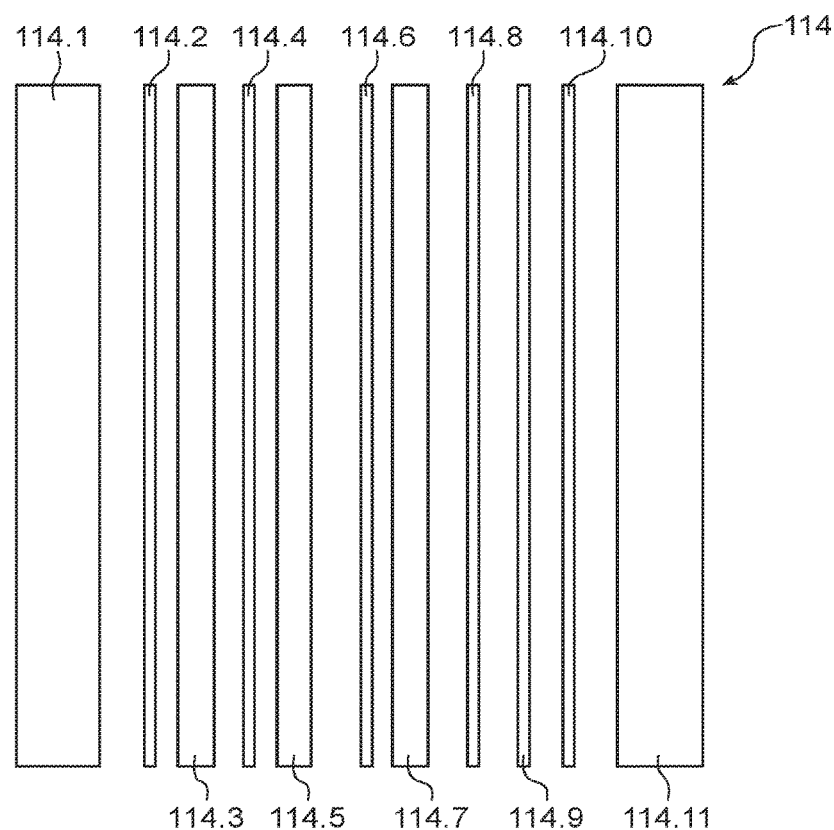
Figure 20:
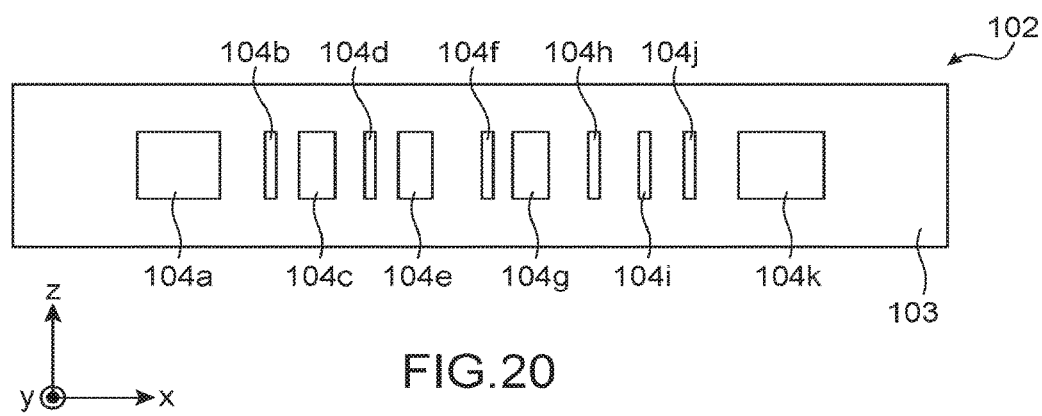

In the different embodiments and alternative embodiments described previously, the device 100 is produced by arranging the switching cells next to each other on the support 102. According to an alternative embodiment, the device 100 may be produced such that several switching cells are superimposed, or stacked, on the support 102. FIGS. 18 to 20 show elements enabling the production of a device 100, here forming a static converter 200 corresponding to the three-phase inverter described previously in conjunction with FIG. 11.

As shown in FIG. 18, three first electronic power components 108.1, 108.2 and 108.3, corresponding to lateral transistors, for example of HEMT type, each intended to form part of one of the three switching cells of the converter 200, are produced from the first silicon substrate 203. Each of the first transistors 108.1, 108.2 and 108.3 comprises, at a front face, a first metallization 202.1, 202.2 and 202.3 connected to the gate of the corresponding first transistor, a second metallization 204.1, 204.2 and 204.3 connected to the drain of the corresponding first transistor and a third metallization 206.1, 206.2 and 206.3 connected to the source of the corresponding first transistor. Three second electronic power components 112.1, 112.2 and 112.3, corresponding to lateral transistors, for example of HEMT type, each intended to form part of one of the three switching cells of the converter 200, are produced from a second silicon substrate 205. Each of the transistors 112.1, 112.2 and 112.3 comprises, at a front face, a first metallization 208.1, 208.2 and 208.3 connected to the gate of the corresponding second transistor, a second metallization 210.1, 210.2 and 210.3 connected to the source or to the drain (according to the type of the second transistors) of the corresponding second transistor, and a third metallization 212.1, 212.2 and 212.3 connected to the drain or to the source (according to the type of the second transistors) of the corresponding second transistor. The transistors 108 and 112 correspond to lateral power components.

As shown in FIG. 19, the electric contact element 114 used for the assembly of the six transistors 108.1-108.3 and 112.1-112.3 to form the static converter 200 comprises eleven separate portions 114.1 to 114.11 in which:
  a first portion 114.1 intended to be in contact with the metallizations 204.1, 204.2 and 204.3 (these three metallizations being aligned with each other due to the fact that they are intended to be in contact with the first portion 114.1);
  a second portion 114.2 intended to be in contact with the metallization 202.1;
  a third portion 114.3 intended to be in contact with the metallizations 206.1 and 212.3;
  a fourth portion 114.4 intended to be in contact with the metallization 202.2;

a fifth portion 114.5 intended to be in contact with the metallizations 206.2 and 212.2 (these two metallizations being produced such that they are located facing each other during the assembly of the transistors 108 to the element 114);

a sixth portion 114.6 intended to be in contact with the metallization 202.3;

a seventh portion 114.7 intended to be in contact with the metallizations 206.3 and 212.1;

an eighth portion 114.8 intended to be in contact with the metallization 208.3;

a ninth portion 114.9 intended to be in contact with the metallization 208.2;

a tenth portion 114.10 intended to be in contact with the metallization 208.1;

an eleventh portion 114.11 intended to be in contact with the metallizations 210.1, 210.2 and 210.3 (these three metallizations being aligned with each other due to the fact that they are intended to be in contact with the eleventh portion 114.11).

A first main face of the element 114 is assembled on the first transistors 108.1-108.3. A second main face of the element 114, opposite its first main face, is assembled on the second transistors 112.1-112.3. The references 207.1 and 207.2 shown in FIG. 18 designate the side of each of the substrates 203, 205 intended to be arranged on the side of the support 102. All the contacts of the static converter 200 are located on one of the edges, named first lateral face, of the assembly produced, due to the fact that all the electrodes of the first and second components 108, 112 of the static converter 200 are connected to the electric contact element 114 arranged between the components 108, 112. The first lateral face of the stack thereby obtained is transferred and assembled on eleven metallizations 104a to 104k of the support 102 shown in FIG. 20 via the portions 114.1-114.11. In this configuration, the length (dimension along the X axis) of the support 102 is for example of the order of 10 mm and its width (dimension along the Z axis) is for example between around 300 μm and 500 μm.

A decoupling capacitor may then be arranged at a second side, or second lateral face, of the stack, that is to say at the second lateral faces of the layers 106, 110, opposite the first lateral faces arranged on the side of the support 102. The metallizations 104a and 104k, which correspond to those on which the continuous electrical supply potentials are intended to be applied, are arranged at the ends of the support 102 in order to facilitate the integration of the decoupling capacitor.

The other details and embodiment possibilities described previously also apply to this alternative embodiment.

Figure 21:
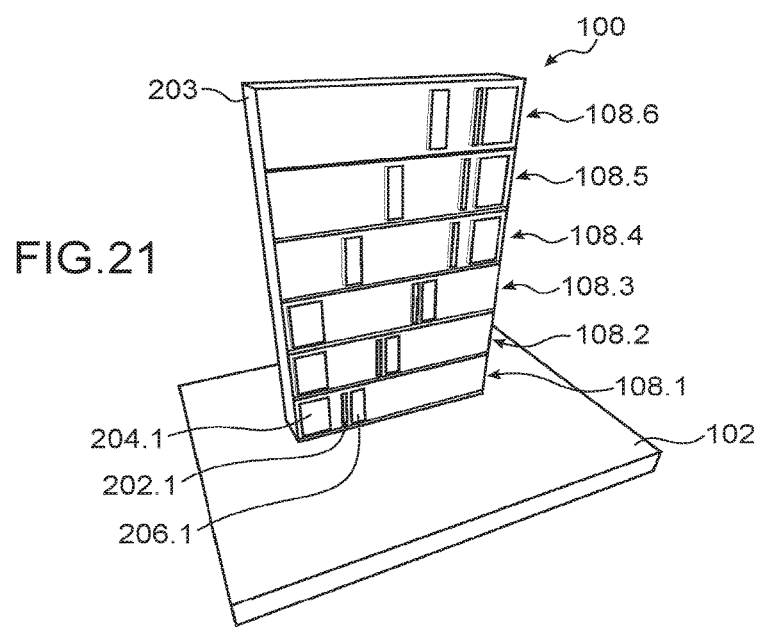
FIGS. 21 to 27 show other alternative embodiments of an electronic power device, subject matter of the present invention.
Figure 22:
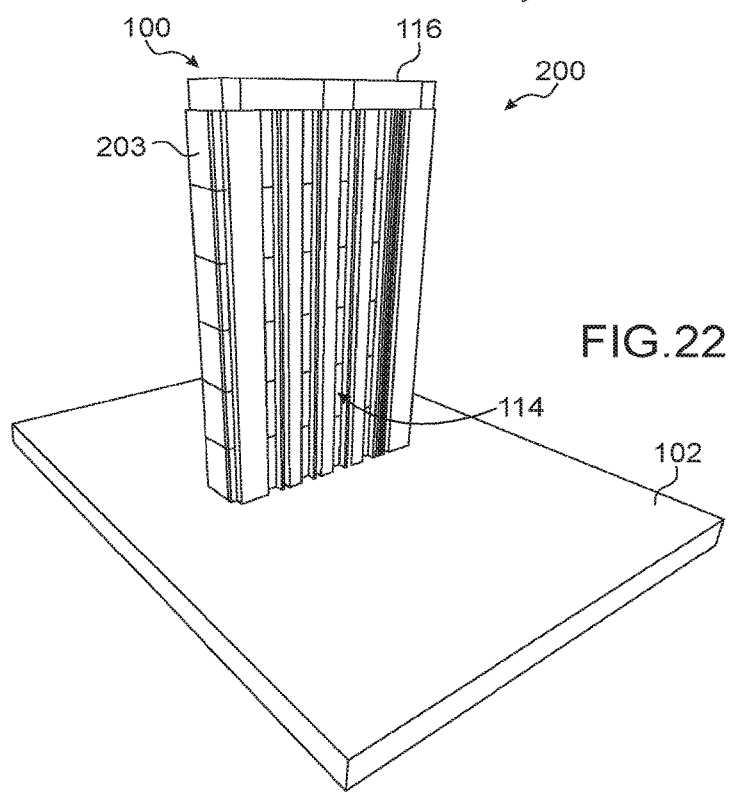

According to another alternative embodiment, the device 100 may be produced such that all the components of the device 100 are produced on a same substrate arranged vertically on the support 102. FIGS. 21 and 22 are described below in relation with the production of the static converter 200 of FIG. 11 according to this other alternative embodiment.

Six transistors 108.1 to 108.6, from which the three switching cells of the converter 200 will be produced, are produced on the substrate 203. The three transistors 108.1 and 108.3 are similar to the transistors 108.1 to 108.3 described previously in relation with FIG. 18, and the three transistors 108.4 to 108.6 are similar to the transistors 112.1 to 112.3 described previously, except that the three transistors 108.4 to 108.6 are produced from the same substrate as the transistors 108.1 to 108.3. The metallizations 202, 204 and 206 of the transistors 108 are arranged at a same face with which the electric contact element 114 is made integral, as shown in FIG. 22. In FIG. 21, only the metallizations 202.1, 204.1 and 206.1 are referenced to make it easier to read this figure. In FIG. 21, the substrate 203 is shown in vertical position on the support 102 in order to make it easier to understand the arrangement of the transistors 108.1-108.6 on the substrate 203 when said substrate is positioned on the support 102. Nevertheless, the electric contact element 114 is made integral, at the level of one of its two main faces, with the metallizations of the transistors 108 prior to the mounting of the stack thereby obtained on the support 102.

This alternative embodiment described in conjunction with FIGS. 21 and 22 is advantageous when the transistors 108 are lateral power transistors for example produced using GaN on silicon technology. According to this technology, the substrate 203 corresponds to a silicon substrate of thickness for example between around 725 μm and 1 mm. The active zones of the transistors 108 are produced in a AlGaN/GaN stack arranged on the substrate 203 and in which the thickness is generally less than around 10 μm. Due to the fact that such lateral power components have a single active face (on the side of the AlGaN/GaN stack), the totality of the currents circulate in this very thin zone. The power density to evacuate is thus important. The silicon substrate 203, making it possible to make compatible the production of such transistors with standard microelectronic production infrastructures, is nevertheless problematic for carrying out cooling of the transistors 108 from their rear face due to the fact that this substrate 203 is thick and that the conductivity of silicon is low (of the order of 148 $W \cdot m^{-1} \cdot K^{-1}$) compared to those of other semiconductor materials used in power electronics such as silicon carbide (of the order of 500 $W \cdot m^{-1} \cdot K^{-1}$). From the device 100 such as shown in FIG. 22, the front face of the transistors 108 is freely accessible via the electric contact element 114. It is thus possible to carry out cooling of the device 100 from the rear face of the substrate 203 but also from the front face of the transistors through the electric contact element 114.

Figure 23:
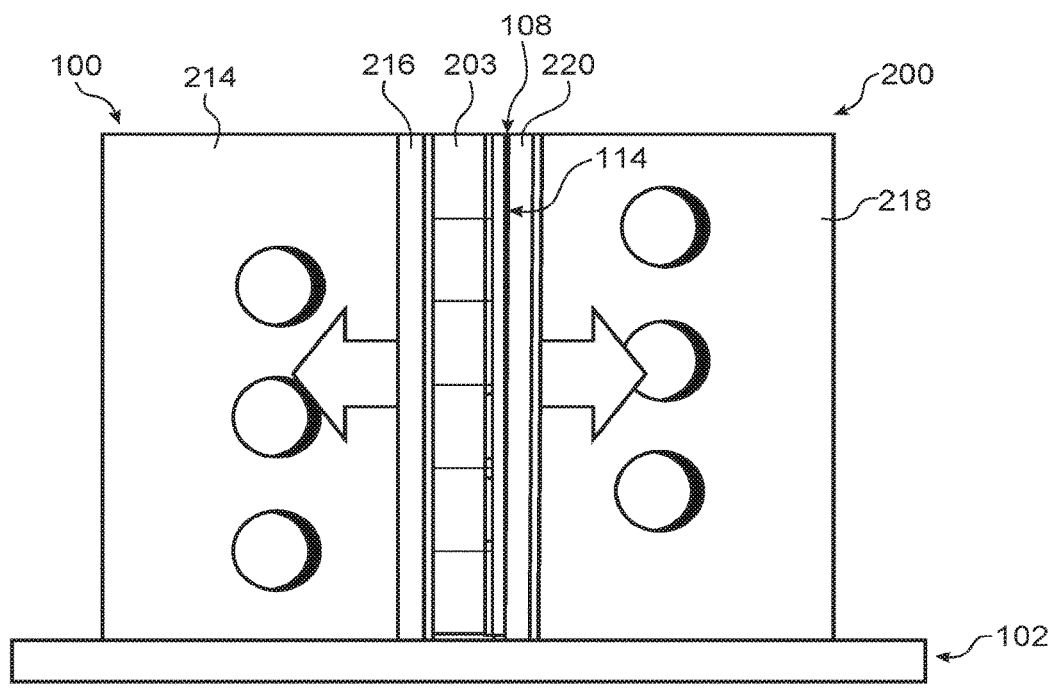

FIG. 23 shows the device 100, which comprises a first heat sink 214 arranged against a rear face of the first substrate 203 (through a dielectric layer 216) and a second heat sink 218 arranged against the electric contact element 114 (through a dielectric layer 220). In this configuration, the second heat sink 218 ensures the major part of the cooling of the device 100. In the exemplary embodiment described with FIG. 23, the heat sinks 214, 218 are of water plate type. The addition of a decoupling capacitor on such a device 100 is possible.

In all the embodiments and alternative embodiments described previously, it is advantageous to produce each switching cell with complementary switches, for example with a first depletion type transistor, or "Normally-On" transistor (that is to say ON in the absence of polarisation voltage applied to its gate) and a second enhancement type transistor; or "Normally-Off" transistor (OFF in the absence of polarisation voltage applied to its gate). In such a configuration, the control of the switching cell may be carried out from a single portion of the electric contact element 114 connected to the gates of these two complementary transistors.

The configuration of the device 100 produced in the form of a stack laid out vertically on the support 102 is also advantageous for combining a lateral power transistor of "Normally-On" type for example produced using HEMT AlGaN/GaN technology, with a lateral MOS transistor of "Normally-Off" type according to a cascode mounting. In such a mounting, shown schematically in FIG. 24, a first HEMT "Normally-On" power transistor 222 comprising GaN comprises its source connected to the drain of a second NMOS "Normally-Off" transistor 224 (which comprises an antiparallel diode connected between its source and its drain). The device 100 formed with such a mounting, corresponding to a power transistor, is also shown symbolically in FIG. 24. This association of the two transistors 222, 224 is sensitive to mesh inductances between the components, particularly at the level of the common point of these two transistors 222, 224 (connection point between the source of the first transistor 222 and the drain of the second transistor 224). In addition, in order to guarantee good control of the transistor 222, the source inductance of the transistor 224 must be as low as possible so as not to perturb the switching order of the drive circuit (driver) which controls this device 100. The production of the device 100 in the form of a stack laid out vertically on the support 102 responds to these problems.

Figure 24:
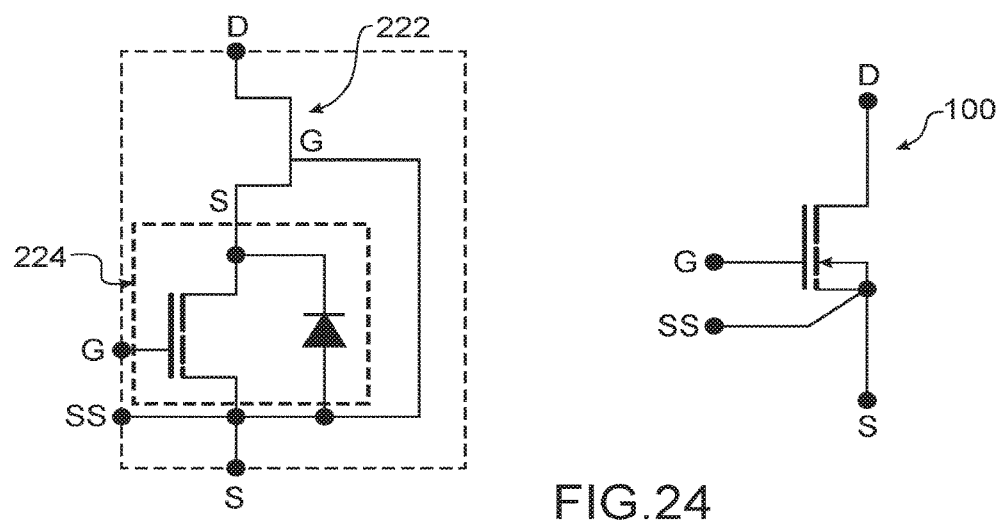
Figure 25:
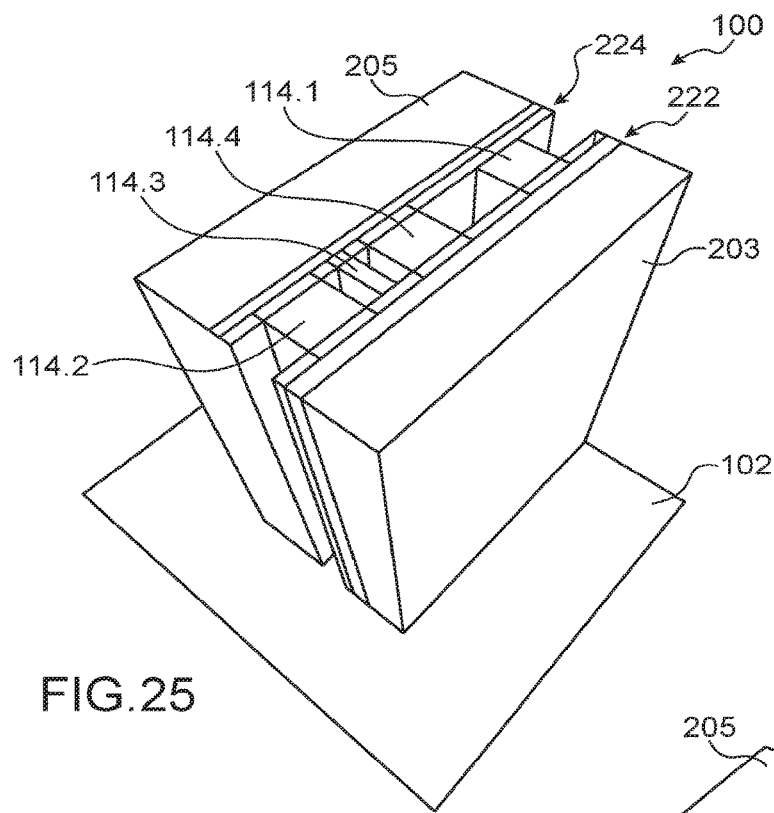

FIG. 25 shows the device 100 produced according to the mounting described in FIG. 24, that is to say comprising the first transistor 222 (corresponding to the first electronic power component 108) produced on a first substrate 203, the second transistor 224 produced on a second substrate 205 for example of SOI type, the two transistors being made integral and electrically connected to each other by the electric contact element 114 due to the fact that these two transistors each comprise their electrodes arranged on a same face, the stack formed being laid out vertically on the support 102. The electric contact element 114 comprises a first portion 114.1 connected to the drain of the first transistor 222, a second portion 114.2 connected to the source of the first transistor 222, a third portion 114.3 connected to the gate of the second transistor 224, and a fourth portion 114.4 connected to a Kelvin connection, or Kelvin electrode, of the source of the device 100, referenced SS in FIG. 24, at the source of the second transistor 224. When several MOS or CMOS transistors are produced on the second substrate 205, as for example during the production of a static converter such as described previously, these transistors are insulated from each other.

Figure 26:
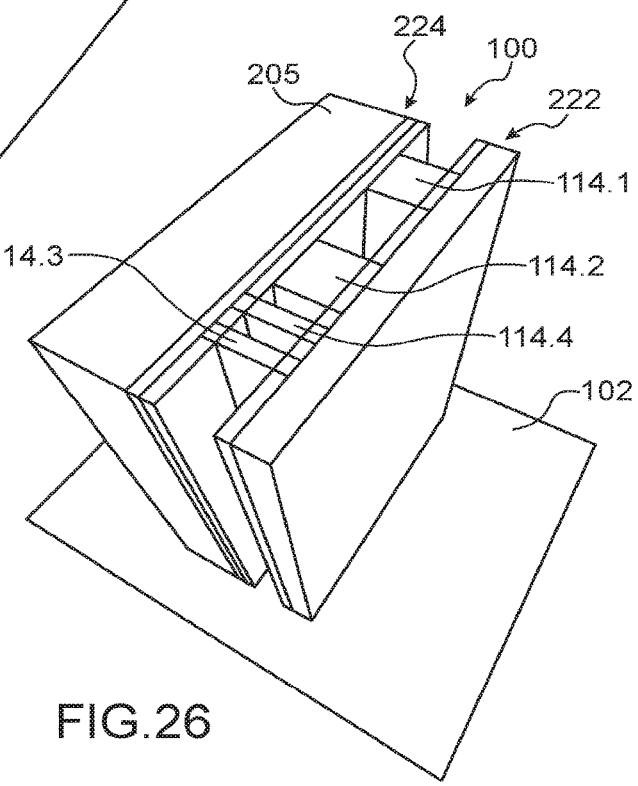

In an alternative embodiment, the device 100 may correspond to the assembly of a first power transistor 222 connected to a first main face of the electric contact element 114, with a control circuit produced using CMOS technology with lateral components and connected to a second main face of the electric contact element 114. This control circuit makes it possible for example to convert a low current control into power control signals suited to power transistors. Such a device 100 is shown in FIG. 26. In this exemplary embodiment, the first substrate 203 is thinned in order that only the layer or the stack of layers comprising GaN forming the active zone of the first transistor 222 is conserved and arranged vertically on the support 102 (which facilitates the cooling of the first transistor 222). The control circuit, here produced using SOI technology, is referenced 226 in FIG. 26. The electric contact element 114 comprises the same portions as those described previously in conjunction with FIG. 25. Such a device 100 may be produced by implementing the following steps:

producing the first power transistor 222 on the first substrate 203 of GaN on silicon type, during which an insulation of the different power components formed on the first substrate 203 is produced in order to maintain the voltage resistance of the monolithic components, and the production of a metal level suited to form metal pads suited to be connected to the electric contact element 114;

producing the control circuit 226 using high voltage SOI technology on the second substrate 205, during which the final metal level formed is compatible with the electric contact element 114, and in which the components are formed in islands;

transfer of the substrates 203, 205 onto the electric contact element 114;

total removal of the silicon support from the first substrate 203, via the implementation of a mechanical planing and a chemical attack;

cutting the stack at the insulation zones of the power components;

transfer and assembly on the support 102.

The production of a power component 222 and its control circuit 226 in the form of such a stack laid out vertically on the support 102 makes it possible to obtain an arrangement of the control circuit 226 as near as possible to the power component 222. This lay out also makes it possible to eliminate the silicon layer used as mechanical support during the production of GaN type power components. Yet, in the presence of this silicon layer, the power components have less good voltage resistance. The elimination of this silicon layer thus makes it possible to increase this voltage resistance of the power components, and makes it possible to avoid premature vertical breakdown, which would be due to the presence of this silicon layer.

Figure 27:
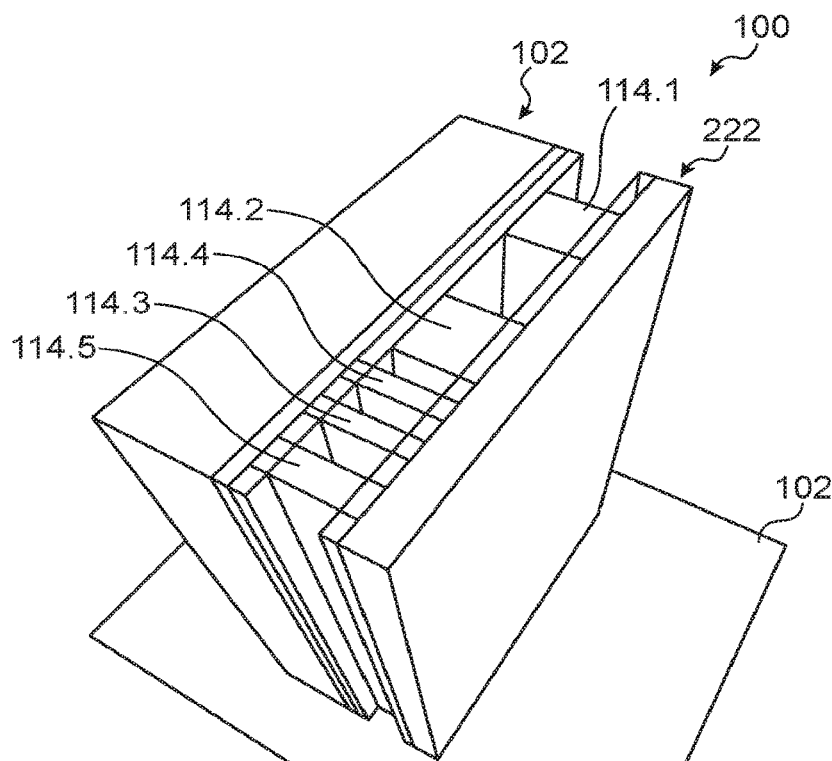

In this configuration, it is also possible that an additional portion 114.5 of the electric contact element electrically connects at least one additional electrode, named for example "sense" electrode, of the control circuit 226 to the power component 222 in order to transmit information items from the power component 222 to the control circuit 226, as shown in FIG. 27. Such an additional electrode serves for example for measuring the temperature of the power component 222 instantaneously. The temperature of the power component 222 is an example of information enabling the control of a power transistor. In an alternative embodiment, this electrode may also serve to transmit information items relative to the current passing through the power transistor or information relative to the ageing of the transistor. This electrode enables the control circuit 226 to react instantaneously on the control of the power component 222 then to relay the information to the upper drive level of the power component 222.

The invention claimed is:

1. An electronic power device comprising:
at least one first electronic power component in which all of electrodes are arranged at a first main face of the at least one first electronic power component;
at least one electric contact element in which a first main face is arranged against the first main face of the at least one first electronic power component and which comprises plural separate electrically conducting portions to which the electrodes of the at least one first electronic power component are electrically connected;
wherein the at least one first electronic power component and the at least one electric contact element together form a stack such that a first lateral face of each of the portions of the at least one electric contact element, substantially perpendicular to the first main face of the at least one electric contact element, is arranged against at least one metallization of a support forming at least one electric contact of the at least one first electronic power component, and
wherein the at least one first electronic power component is a lateral electronic power component.

2. The electronic power device according to claim 1, wherein the at least one first electronic power component comprises a first semiconductor substrate forming a second main face, opposite the first main face, of the at least one first electronic power component.

3. The electronic power device according to claim 1, comprising plural first electronic power components such that all the electrodes of each of the first electronic power components are arranged at a first main face of each of the first electronic power components and electrically connected to the portions of the at least one electric contact element at the first main face of the at least one electric contact element, and such that the first electronic power components are arranged one above the other along a direction substantially perpendicular to the first lateral faces of the portions of the at least one electric contact element.

4. The electronic power device according to claim 3, wherein the first electronic power components together form plural switching cells, each switching cell being formed by two of the first electronic power components electrically connected together by at least one of the portions of the at least one electric contact element.

5. The electronic power device according to claim 1, further comprising at least one heat sink arranged against a second main face, opposite the first main face, of the at least one electric contact element.

6. The electronic power device according to claim 1, further comprising at least one second electronic power component in which all of electrodes are arranged at a first main face of the at least one second electronic power component,
wherein a second main face, opposite the first main face, of the at least one electric contact element is arranged against the first main face of the at least one second electronic power component, the electrodes of the at least one second electronic power component being electrically connected to the portions of the at least one electric contact element, and
wherein the at least one second electronic power component forms part of the stack and forms, with the at least one first electronic power component, a switching cell.

7. The electronic power device according to claim 6, wherein each of the at least one first electronic power component and the at least one second electronic power component comprises at least one transistor or at least one thyristor or at least one rectifier diode.

8. The electronic power device according to claim 6, wherein the at least one second electronic power component comprises a second semiconductor substrate forming a second main face, opposite the first main face, of the at least one second electronic power component.

9. The electronic power device according to claim 6, comprising plural second electronic power components such that all the electrodes of each of the second electronic power components are arranged at a first main face of each of the second electronic power components and electrically connected to the portions of the at least one electric contact element at the second main face of the at least one electric contact element, and such that the second electronic power components are arranged one on top of the other along a direction substantially perpendicular to the first lateral faces of the portions of the at least one electric contact element.

10. The electronic power device according to claim 3, comprising plural second electronic power components such that all the electrodes of each of the second electronic power components are arranged at a first main face of each of the second electronic power components and electrically connected to the portions of the at least one electric contact element at the second main face of the at least one electric contact element, and such that the second electronic power components are arranged one on top of the other along a direction substantially perpendicular to the first lateral faces of the portions of the at least one electric contact element, and
wherein each of the first electronic power components is electrically connected to one of the second electronic power components by one of the portions of the at least one electric contact element while together forming a switching cell.

11. The electronic power device according to claim 1, further comprising at least one second MOS type electronic component in which all of electrodes are arranged at a first main face of the at least one second MOS type electronic component, in which a second main face, opposite the first main face, of the at least one electric contact element is arranged against the first main face of the at least one second MOS type electronic component, the electrodes of the at least one second MOS type electronic component being electrically connected to the portions of the at least one electric contact element.

12. The electronic power device according to claim 11, comprising plural second MOS type electronic components forming a circuit for controlling the at least one first electronic power component, or wherein the at least one first electronic power component is a depletion transistor and the at least one second MOS type electronic component is an enhancement transistor electrically coupled to the at least one first electronic power component according to a cascode type mounting.

13. The electronic power device according to claim 1, comprising at least one switching cell formed by plural first electronic power components, or by the at least one first electronic component and at least one second electronic component, or by plural second electronic power components, and further comprising at least one of the following elements:
a decoupling capacitor connected to the at least one switching cell such that the at least one switching cell is arranged between the support and the decoupling capacitor,
a control circuit configured to control a switching of the at least one switching cell and arranged on a rear face of the support which is opposite a front face of the support at which are located the at least one metallization,
at least one heat sink arranged against the at least one switching cell.

14. The electronic power device according to claim 13, wherein the at least one heat sink forms part of a package resting on the support and wherein the stack is arranged, a bottom wall of the package forming an additional heat sink.

15. A static converter comprising at least one electronic power device according to claim 1, the at least one electronic power device forming at least one switching cell.

16. A method for producing an electronic power device, comprising:
producing at least one first electronic power component in which all of electrodes are arranged at a first main face of the at least one first electronic power component;
making the at least one first electronic power component integral with at least one electric contact element such that a first main face of the at least one electric contact element is arranged against the first main face of the at least one first electronic power component, electrically connecting plural separate portions of the at least one electric contact element to the electrodes of the at least one first electronic power component, the at least one first electronic power component and the at least one electric contact element together forming a stack;

making at least one first lateral face of each of the portions of the at least one electric contact element, substantially perpendicular to the first main face of the at least one electric contact element, integral against at least one metallization of a support forming at least one electric contact of the at least one first electronic power component; and wherein the at least one first electronic power component is a lateral electronic power component.

17. The method according to claim 16, further comprising, before making the at least one electric contact element integral with the support:

producing at least one second electronic power component in which all of electrodes are arranged at a first main face of the at least one second electronic power component;

making the at least one second electronic power component integral with a second main face, opposite the first main face, of the at least one electric contact element, such that the second main face of the at least one electric contact element is arranged against the first main face of the at least one second electronic power component and electrically connecting the electrodes of the at least one second electronic power component to the portions of the at least one electric contact element, the at least one second electronic power component forming part of the stack and forming, with the at least one first electronic power component, a switching cell.

18. The method according to claim 17, wherein:

the at least one first electronic power component is produced collectively with plural other first electronic power components in a first semiconductor substrate, the at least one second electronic power component is produced collectively with plural other second electronic power components in a second semiconductor substrate, the first and second electronic power components are made integral with a structured metal layer forming plural electric contact elements between the first and second electronic power components; and further comprising cutting the first and second semiconductor substrates and the structured metal layer at a level of the electric contacts of the stack, forming plural assemblies each comprising at least one switching cell.

19. The method according to claim 18, wherein the structured metal layer comprises a first part arranged on the first electronic power components and a second part arranged on the second electronic power components, and wherein the electric contact elements are formed by joining the first and second parts of the structured metal layer.

20. The method according to claim 16, further comprising making of at least one switching cell formed by plural first electronic power components, or by the at least one first electronic component and at least one second electronic component, or by plural second electronic power components; and further comprising at least one of:

an assembly of at least one decoupling capacitor on a lateral face of the stack, electrically connected to the at least one switching cell such that the at least one switching cell is arranged between the support and the decoupling capacitor, an assembly of at least one control circuit, configured to control a switching of the at least one switching cell, on a rear face of the support opposite a front face at which are located the at least one metallization, an assembly of at least one heat sink against the at least one switching cell.

21. The method according to claim 20, wherein the at least one heat sink forms part of a package resting on the support and in which the stack is arranged, a bottom wall of the package forming an additional heat sink.

22. A method for producing a static converter, comprising implementation of the method for producing an electronic power device according to claim 16, the at least one electronic power device forming at least one switching cell.

23. A method for producing an electronic power device, comprising:

collectively producing plural first electronic power components at a first main face of a first substrate;

making the first electronic power components integral with a structured metal plate forming plural electric contact elements such that the first electronic power components are arranged between the electric contact elements and the first substrate and are electrically connected to the first main faces of the electric contact elements, and such that the first substrate, the first electronic power components and the electric contact elements together form a stack;

cutting the stack substantially perpendicularly to the first main faces of the first substrate and of the electric contact elements, forming lateral faces of the electric contact elements substantially perpendicular to the first main faces of the electric contact elements to form electric contacts of the first electronic power components; and making the electric contacts of the first electronic power components located on the lateral faces of the electric contact elements integral against metallizations of a support.

24. The method according to claim 23, wherein the first electronic power components are produced collectively from a first semiconductor substrate transferred beforehand onto a first metal layer then etched such that the first electronic power components are insulated from each other, the first electronic power components being electrically connected to the first metal layer, and wherein the first lateral faces of the cut parts of the first metal layer form part of the electric contacts of the first electronic power components arranged against the metallizations of the support during the making integral with the support.

25. The method according to claim 23, wherein the first electronic power components are produced collectively in a first semiconductor substrate, and wherein all of electrodes of the first electronic power components are connected to the electric contact elements.

26. The method according to claim 23, wherein the first electronic power components together form plural switching cells, each of the switching cells being formed by two first electronic power components electrically connected together by at least one portion of one of the electric contact elements.

27. The method according to claim 23, further comprising:

collectively producing plural second electronic components, which are electronic power components or MOS type electronic components, at a first main face of a second substrate;

making the second electronic components integral with the structured metal plate, the electric contact elements being arranged between the first electronic power components and the second electronic components and electrically connected to the second electronic components, and such that the second substrate and the second electronic components form part of the stack;

wherein the lateral faces of the electric contact elements also correspond to electric contacts of the second electronic components which are made integral against the metallizations of the support.

28. The method according to claim 27, wherein the first electronic power components and the second electronic components together form plural switching cells, and wherein each of the electric contact elements comprises at least one first metal portion to which are connected one of the first electronic power components and one of the second electronic components while forming a mid-point of one of the switching cells.

29. The method according to claim 28, wherein:
the second electronic components are produced collectively from a second semiconductor substrate transferred beforehand onto a second metal layer then etched such that the second electronic components are insulated from each other, the second electronic components being electrically connected to the second metal layer,
for each switching cell, the first lateral faces of the cut parts of the first and second metal layers form at least some electrodes of the switching cell on which electrical supply potentials of the switching cell are intended to be applied, and
the first lateral faces of the cut parts of the first and second metal layers are arranged against the metallizations of the support.

30. The method according to claim 28, wherein:
the second electronic components are produced collectively in a second semiconductor substrate,
for each switching cell, all of electrodes of the first electronic power components and of the second electronic components are connected to the electric contact elements, and the electric contact elements comprise second metal portions forming at least some electrodes of the switching cell on which electrical supply potentials of the switching cell are intended to be applied, the first lateral faces of the second metal portions, substantially perpendicular to the main faces of the first and second substrates, are arranged against the metallizations of the support.

31. The method according to claim 27, wherein the structured metal plate comprises a first part arranged on the first electronic power components and a second part arranged on the second electronic components, and wherein the electric contact elements are formed by joining the first and second parts of the structured metal plate.

32. The method according to claim 23, further comprising making of at least one switching cell formed by the first electronic power components, or by the first electronic components and at least one second electronic component which is an electronic power component or a MOS type electronic component, or by plural second electronic components, and further comprising at least one of:
an assembly of at least one decoupling capacitor on one lateral face of the stack, electrically connected to the at least one switching cell such that the at least one switching cell is arranged between the support and the decoupling capacitor,
an assembly of at least one control circuit, configured to control a switching of the at least one switching cell, on a rear face of the support opposite a front face at which are located the metallizations,
an assembly of at least one heat sink against the at least one switching cell.

33. The method according to claim 32, wherein the at least one heat sink forms part of a package resting on the support and wherein the stack is arranged, a bottom wall of the package forming an additional heat sink.

34. A method for producing a static converter, comprising implementation of the method for producing an electronic power device according to claim 23.

* * * * *